US012040384B2

(12) United States Patent
Chen

(10) Patent No.: US 12,040,384 B2
(45) Date of Patent: Jul. 16, 2024

(54) SOURCE/DRAIN STRUCTURE FOR SEMICONDUCTOR DEVICE

(71) Applicant: Taiwan Semiconductor Manufacturing Co., Ltd., Hsinchu (TW)

(72) Inventor: Lung Chen, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 202 days.

(21) Appl. No.: 17/459,469

(22) Filed: Aug. 27, 2021

(65) Prior Publication Data

US 2023/0064000 A1    Mar. 2, 2023

(51) Int. Cl.
| | |
|---|---|
| *H01L 29/66* | (2006.01) |
| *H01L 21/02* | (2006.01) |
| *H01L 21/8234* | (2006.01) |
| *H01L 29/08* | (2006.01) |
| *H01L 29/78* | (2006.01) |

(52) U.S. Cl.
CPC .. *H01L 29/66795* (2013.01); *H01L 21/02293* (2013.01); *H01L 21/823431* (2013.01); *H01L 29/0847* (2013.01); *H01L 29/7851* (2013.01)

(58) Field of Classification Search
CPC ......... H01L 29/66795; H01L 21/02293; H01L 21/823431; H01L 29/0847; H01L 29/7851; H01L 29/456; H01L 29/775; H01L 29/7848; H01L 29/41766; H01L 29/66545; H01L 29/785; B82Y 10/00
See application file for complete search history.

(56) References Cited

U.S. PATENT DOCUMENTS

| | | | |
|---|---|---|---|
| 6,198,167 B1 * | 3/2001 | Economikos | ..... H01L 21/28525 257/E21.171 |
| 7,015,116 B1 | 3/2006 | Lo et al. | |

(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.

(Continued)

*Primary Examiner* — Karen Kusumakar
*Assistant Examiner* — Adam S Bowen
(74) *Attorney, Agent, or Firm* — Sterne, Kessler, Goldstein & Fox P.L.L.C.

(57) ABSTRACT

The present disclosure describes a semiconductor structure and a method for forming the same. The method can include forming a recess structure in a substrate and forming a first semiconductor layer over the recess structure. The process of forming the first semiconductor layer can include doping first and second portions of the first semiconductor layer with a first n-type dopant having first and second doping concentrations, respectively. The second doping concentration can be greater than the first doping concentration. The method can further include forming a second semiconductor layer over the second portion of the first semiconductor layer. The process of forming the second semiconductor layer can include doping the second semiconductor layer with a second n-type dopant.

20 Claims, 14 Drawing Sheets

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,812,363 B1 | 11/2017 | Liao et al. |
| 9,859,380 B2 | 1/2018 | Lee et al. |
| 2014/0077279 A1 | 3/2014 | Tu |
| 2014/0183562 A1* | 7/2014 | Kiyosawa ........... H01L 29/7395 257/77 |
| 2015/0270122 A1 | 9/2015 | Tolle et al. |
| 2015/0348966 A1 | 12/2015 | Zhao et al. |
| 2016/0049335 A1 | 2/2016 | Liu et al. |
| 2016/0148932 A1 | 5/2016 | Fujita et al. |
| 2016/0308048 A1 | 10/2016 | Ching et al. |
| 2017/0250183 A1 | 8/2017 | Brunco |
| 2020/0105934 A1* | 4/2020 | Ma .................. H01L 29/785 |
| 2020/0313001 A1* | 10/2020 | Keech ............... H01L 29/41791 |

OTHER PUBLICATIONS

Luo, Jie-Xin, et al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

* cited by examiner

SOURCE/DRAIN STRUCTURE FOR SEMICONDUCTOR DEVICE

BACKGROUND

Advances in semiconductor technology has increased the demand for field effect transistors (FETs) with higher performance for faster processing systems. To meet this demand, it is important to reduce the FET's channel resistance to minimize transistor delay (e.g., resistive-capacitive (RC) delay). An underlap between the FET's gate terminal and the FET's source/drain terminal can contribute to the FET's channel resistance.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
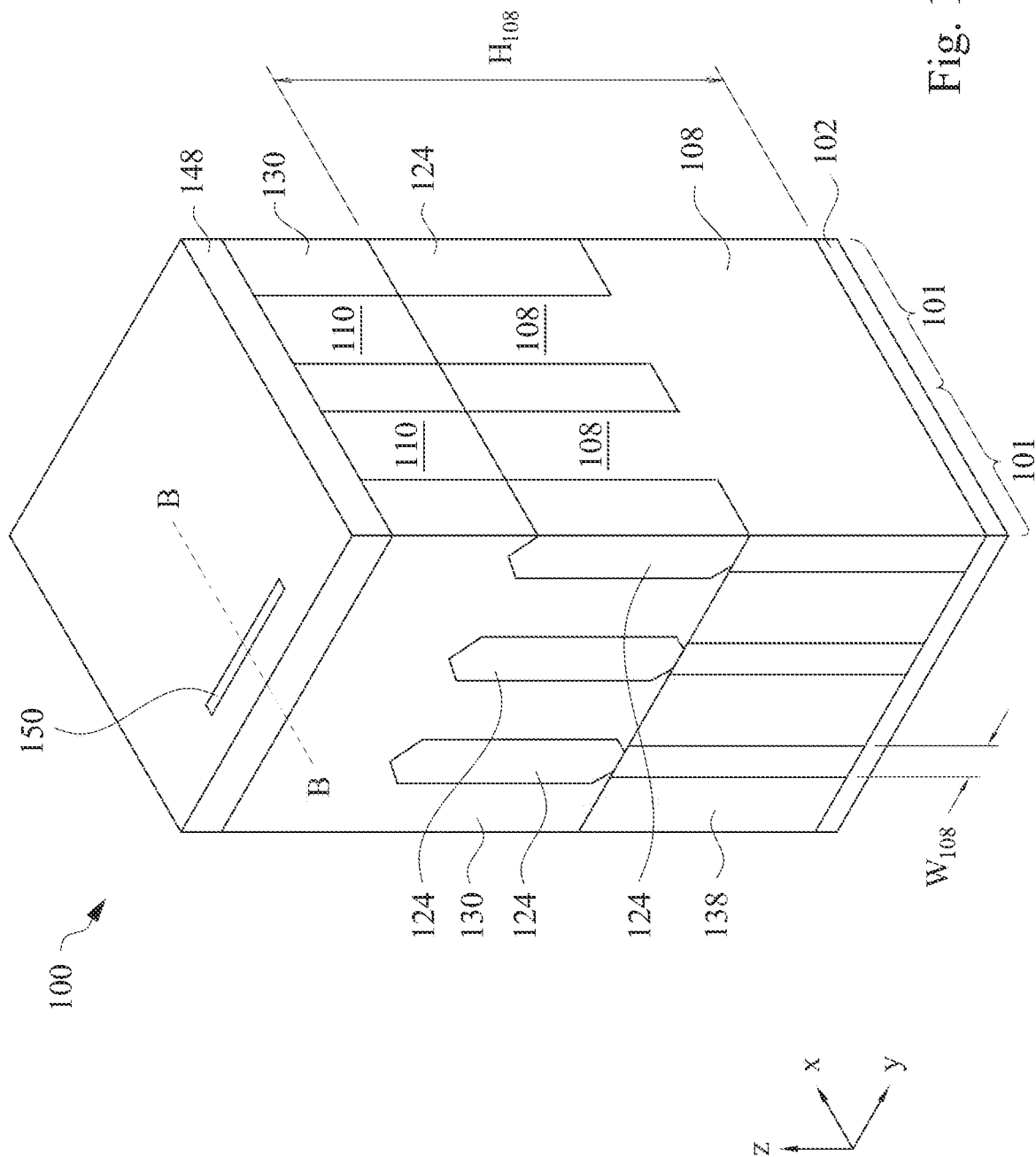
FIG. 1 illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Fins associated with fin field effect transistors (finFETs) or gate-all-around (GAA) FETs may be patterned by any suitable method. For example, the fins may be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Technology advances in the semiconductor industry drive the pursuit of integrated circuits (ICs) having higher performance for high-speed applications. In the course of the IC evolution, the source/drain (S/D) region has been heavily doped to reduce contact resistance to improve transistor speed. However, the heavily doped S/D structure can cause an out-diffusion of the dopants towards the channel. The out-diffusion of the dopants can cause a short channel effect, such as drain-induced barrier lowering (DIBL), thus causing electrical leakage current between the adjacent transistors.

To address the aforementioned challenges, this disclosure is directed to a fabrication method and structures that provide a reduced short channel effect for a transistor. The transistor can be an n-channel field effect transistor (NFET) with a channel region sandwiched by n-type S/D regions. The S/D region can include a first semiconductor layer formed over the channel region and a second semiconductor formed over the first semiconductor layer. The first semiconductor can be doped with a first n-type dopant, such as phosphorus. The second semiconductor can be doped with a second n-type dopant, such as arsenic. In some embodiments, the second n-type dopant can have a greater atomic mass than the first n-type dopant. For example, the first n-type dopant can be phosphorus, and the second n-type dopant can be arsenic. In some embodiments, the second n-type dopant can include a group-V elements (e.g., phosphorus), and the first n-type dopant can be group-V-free (e.g., the first n-type dopant does not belong to group-V element, such as carbon). Further, the first n-type dopant doped in the first semiconductor layer can have a spike doping profile. The spike doping profile can have a maximum peak doping concentration proximate to the interface between the first and second semiconductor layers. The spike doping profile can have a full width at half maximum (FWHM) of the peak doping concentration less than the first semiconductor layer's thickness. For example, a ratio of the spike doping profile's FWHM to the first semiconductor layer's thickness can be less than about 0.5, less than about 0.4, less than about 0.3, or less than about 0.2. The first semiconductor layer doped with the first n-type dopant of the spike doping profile can block and reduce the out-diffusion of the second n-type dopant from the second semiconductor layer towards the channel. Accordingly, a benefit of the present disclosure, among others, is to reduce the transistor's short channel effect, thus improving transistor static power consumption and threshold voltage control.

Figure 2:
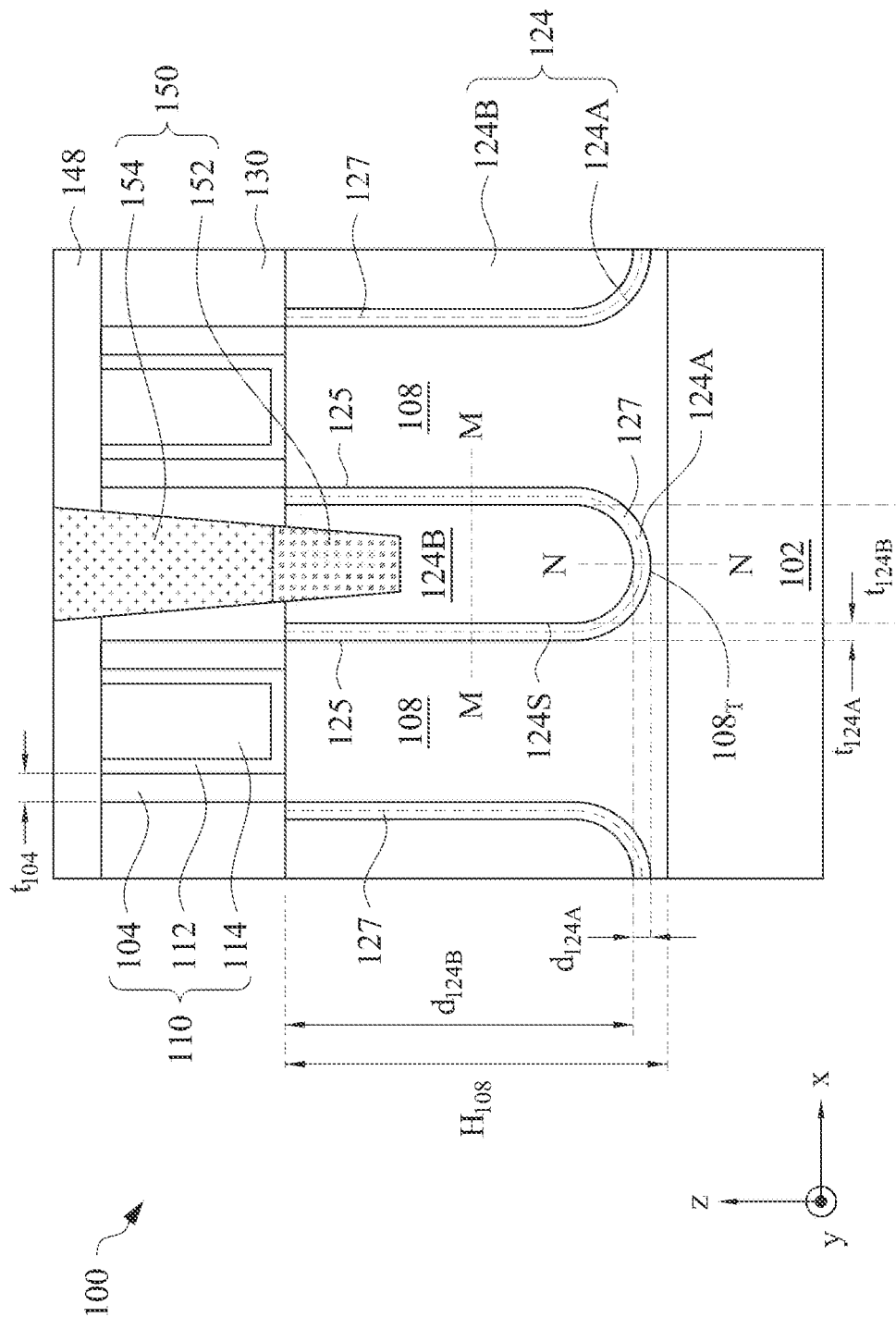
FIGS. 2 and 3 illustrate cross-sectional views of a semiconductor device, according to some embodiments.
Figure 3:
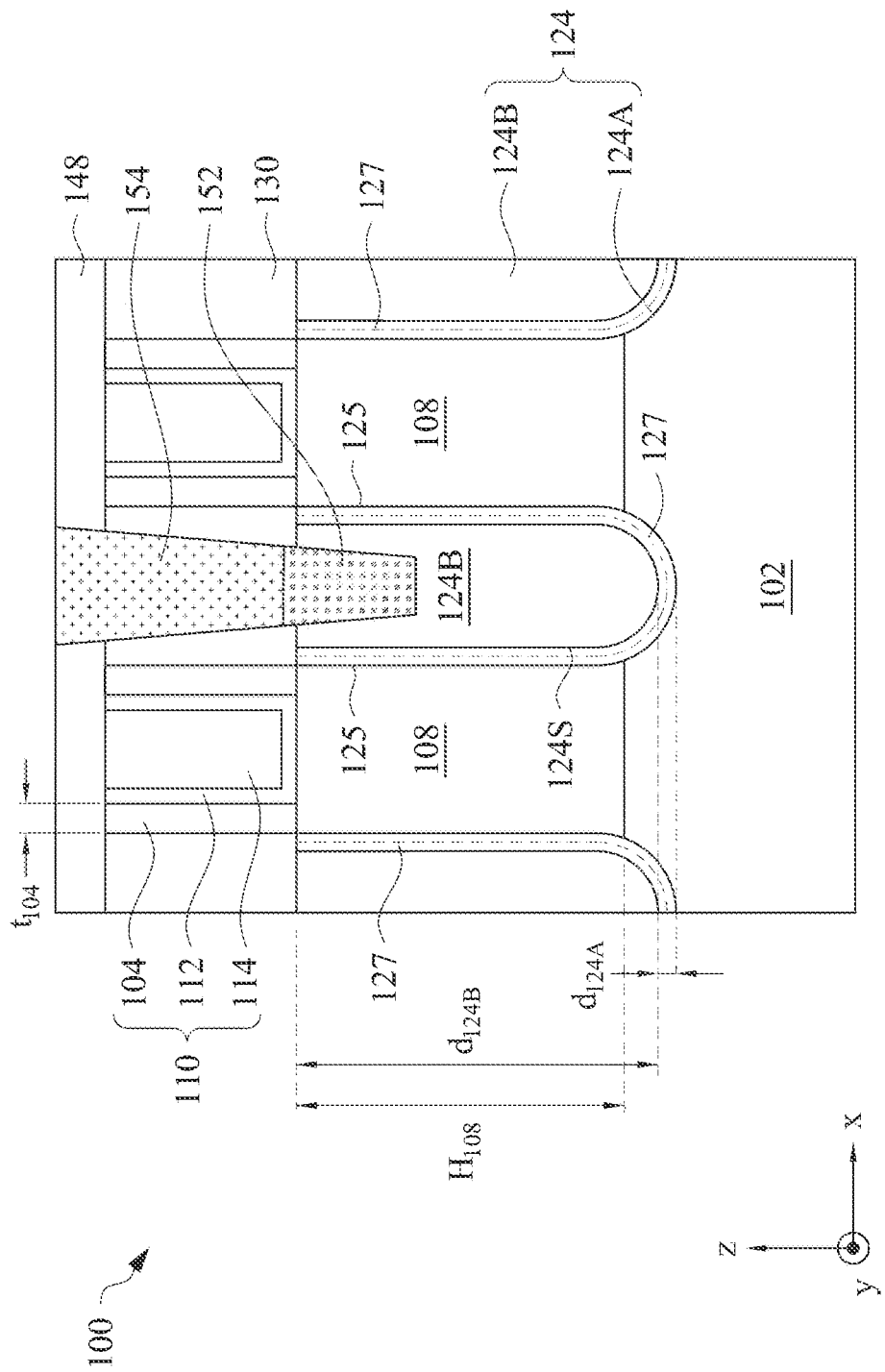
Figure 4:
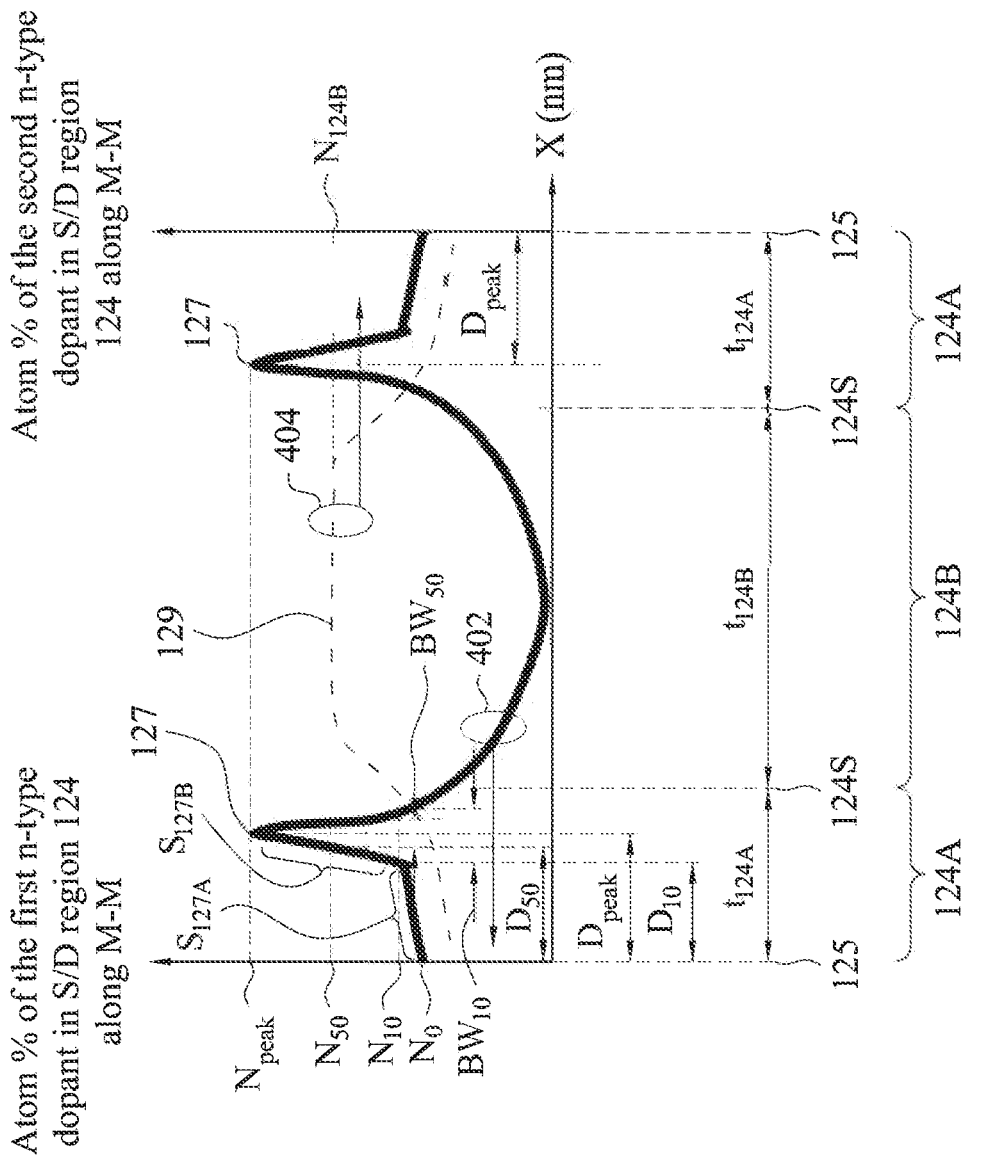
FIGS. 4 and 5 illustrate doping profiles of a semiconductor device, according to some embodiments.
Figure 5:
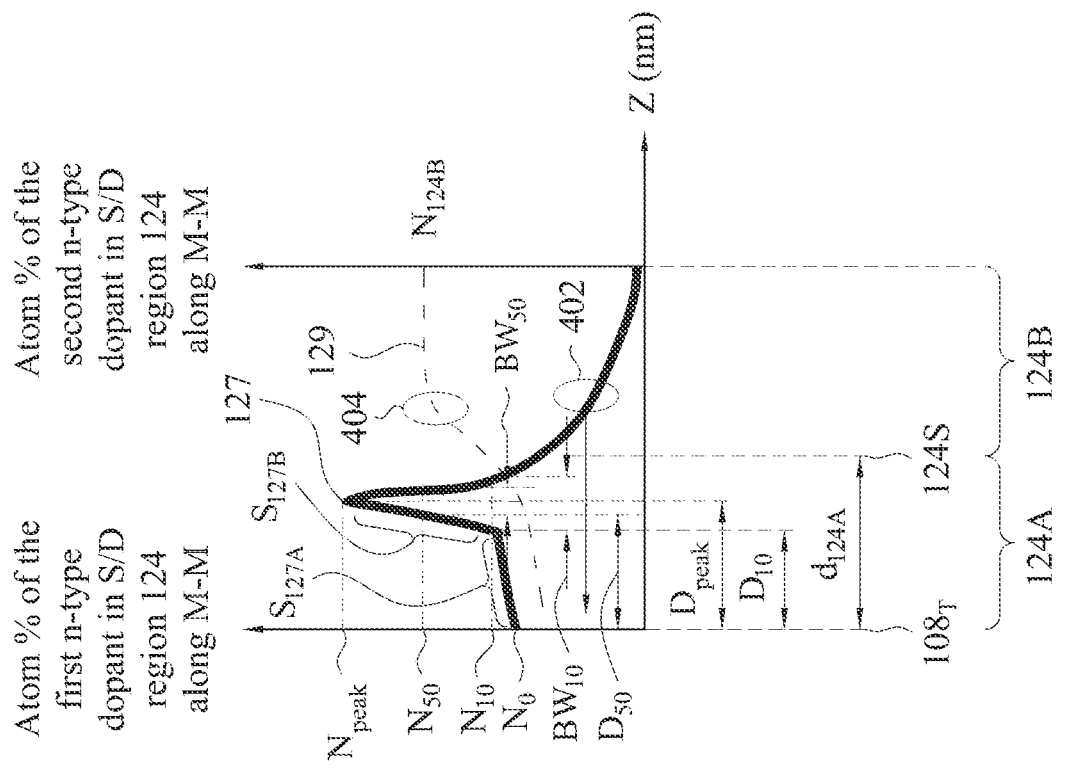

A semiconductor device 100 having multiple field effect transistors (FETs) 101 formed over a substrate 102 is described with reference to FIGS. 1-5, according to some embodiments. Semiconductor device 100 can be included in a microprocessor, memory cell, or other integrated circuit (IC). FIG. 1 illustrates an isometric view of semiconductor device 100, according to some embodiments. FIG. 2 illustrates a cross-sectional view along a source/drain (S/D) region (e.g., line B-B of FIG. 1) of semiconductor device 100, according to some embodiments. FIG. 3 illustrates a cross-sectional view along a source/drain (S/D) region (e.g., line B-B of FIG. 1) of semiconductor device 100, according to some embodiments. FIG. 4 illustrates atomic concentrations of dopants along the S/D region (e.g., line M-M of FIG. 2) of semiconductor device 100, according to some embodiments. FIG. 5 illustrates atomic concentrations of dopants along the S/D region (e.g., line N-N of FIG. 2) of semiconductor device 100, according to some embodiments. The discussion of elements in FIGS. 1-5 with the same annotations applies to each other, unless mentioned otherwise. Semiconductor device 100 can be included in a microprocessor, memory cell, or other integrated circuit (IC). Also, even though FET 101 shown in FIGS. 1-3 is a fin field effect transistor (finFET), FET 101 can be a gate-all-around (GAA) FET, according to some embodiments.

Referring to FIG. 1, substrate 102 can be a semiconductor material, such as silicon. In some embodiments, substrate 102 can include a crystalline silicon substrate (e.g., wafer). In some embodiments, substrate 102 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped depending on design requirements (e.g., p-type substrate or n-type substrate). In some embodiments, the term "p-type" defines a structure, layer, and/or region as being doped with p-type dopants, such as boron. In some embodiments, the term "n-type" defines a structure, layer, and/or region as being doped with n-type dopants, such as arsenic. In some embodiments, substrate 102 can be doped with p-type dopants (e.g., boron, indium, aluminum, or gallium) or n-type dopants (e.g., phosphorus or arsenic).

Each FET 101 can include a fin structure 108 extending along an x-axis, a gate structure 110 traversing through fin structure 108 along a y-axis, and S/D regions 124 formed over portions of fin structure 108. The portion of fin structure 108 traversed by gate structure 110 can be FET 101's channel region. In some embodiments, FET 101 can be an n-channel FET (NFET), where FET 101's channel region can conduct electron carriers. In some embodiments, FET 101 can be a p-channel FET (PFET), where FET 101's channel region can conduct hole carriers. Although FIG. 1 shows each fin structure 108 accommodating two FETs 101, any number of FETs 101 can be disposed along each fin structure 108. In some embodiments, FET 101 can include multiple fin structures 108 extending along a first horizontal direction (e.g., in the x-direction) and gate structure 110 traversing through the multiple fin structures 108 along a second horizontal direction (e.g., in the y-direction). In some embodiments, multiple FETs 101 can have a common gate structure 110.

Each fin structure 108 can be formed over substrate 102 with a suitable width $W_{108}$, such as from about 5 nm to about 50 nm, and a suitable height $H_{108}$, such as from about 10 nm to about 100 nm. Fin structure 108 can be made of a material similar to substrate 102. For example, fin structure 108 can be made of a material having a lattice constant substantially equal to (e.g., lattice mismatch within 5%) that of substrate 102. In some embodiments, fin structure 108 can include a material identical to substrate 102. Portions of fin structure 108 that is traversed by gate structure 110 can be FET 101's channel region. In some embodiments, FET 101's channel region can be made of a material having a lattice constant substantially equal to (e.g., lattice mismatch within 5%) that of substrate 102. Fin structure 108 can be p-type doped, n-type doped, or un-doped. In some embodiments, FET 101 can be an NFET, where fin structure 108 can be un-doped or doped with p-type dopants, such as boron, indium, aluminum, and gallium. In some embodiments, FET 101 can be a PFET, where fin structure 108 can be un-doped or doped with n-type dopants, such as phosphorus and arsenic.

Semiconductor device 100 can further include shallow trench isolation (STI) regions 138 configured to provide electrical isolation between fin structures 108. Also, STI regions 138 can provide electrical isolation between FETs 101 and neighboring active and passive elements (not shown in FIG. 1) integrated with or deposited on substrate 102. In some embodiments, fin structure 108's height $H_{108}$ can be a vertical (e.g., in the z-direction) separation between fin structure 108's height and STI region 138's bottom. In some embodiments, the term "vertical" means nominally perpendicular to the surface of substrate 102. In some embodiments fin structure 108's width $W_{108}$ can be a horizontal (e.g., in the y-direction) separation between two horizontally (e.g., in the y-direction) adjacent STI regions 138. STI regions 138 can include one or more layers of dielectric material, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials.

Referring to FIG. 2, gate structure 110 can be multi-layered structures that wraps around portions of one or more fin structures 108 to modulate FET 101. In some embodiments, gate structure 110 can be referred to as gate-all-around (GAA) structures, where FET 101 can be referred to as a GAA FET 101. Gate structure 110 can include a gate dielectric layer 112, a gate electrode 114 disposed on dielectric layer 112, and gate spacers 104 disposed on sidewalls of gate electrode 114.

Gate dielectric layer 112 can be wrapped around portions of fin structure 108 and can be further disposed between gate electrode 114 and S/D regions 124 to prevent an electrical short in between. Gate dielectric layer 112 can include any suitable dielectric material with any suitable thickness that can provide channel modulation for FET 101. In some embodiments, gate dielectric layer 112 can include silicon oxide and a high-k dielectric material (e.g., hafnium oxide or aluminum oxide), and gate dielectric layer 112 can have a thickness ranging from about 1 nm to about 5 nm. Other materials and thicknesses for gate dielectric layer 112 are within the scope and spirit of this disclosure.

Gate electrode 114 can function as a gate terminal for FET 101. Gate electrode 114 can include a metal stack wrapping around portions of fin structure 108. Gate electrode 114 can include any suitable conductive material that provides a suitable work function to modulate FET 101. In some embodiments, gate electrode 114 can include titanium nitride, tantalum nitride, tungsten nitride, titanium, aluminum, copper, tungsten, tantalum, copper, or nickel (Ni). Other materials for gate electrode 114 are within the scope and spirit of this disclosure.

Gate spacer 104 can be in physical contact with gate dielectric layers 112, according to some embodiments. Gate spacer 104 can have a low-k material with a dielectric constant less than about 3.9. For example, gate spacer 104 can include insulating material, such as silicon oxide, silicon nitride, a low-k material, and a combination thereof. In some embodiments, gate spacer 104 can have a thickness $t_{104}$ ranging from about 2 nm to about 10 nm. Other materials and thicknesses for gate spacer 104 are within the scope and spirit of this disclosure.

Each FET 101 can have S/D regions 124 formed at opposite sides (e.g., along x-direction) of FET 101's channel region. For example, S/D region 124 can be formed over portions of fin structure 108 that are at opposite sides (e.g., along x-direction) of gate structure 110. S/D region 124 can be made of a semiconductor material, such as an element semiconductor material (e.g., Si or Ge), a compound semiconductor material (e.g., GaAs or AlGaAs), a semiconductor alloy (e.g., SiGe or GaAsP), and a semiconductor monopnictide (e.g., silicon arsenic, silicon phosphorus). In some embodiments, FET 101 can be an NFET, where S/D region 124 can be doped with n-type dopants (e.g., phosphorus, arsenic, sulfur, or selenium) to provide electron carriers for FET 101. In some embodiments, FET 101 can be an NFET, where S/D region 124 can be made of an n-type layer stack of epitaxially-grown semiconductor material that provides electrons to FET 101's channel region.

Referring to FIG. 2, S/D region 124 can include a first layer 124A formed over fin structure 108. First layer 124A can be made of an n-type semiconductor material that provides electrons to FET 101's channel region. Further, first layer 124A can reduce FET 101's short channel effect by reducing the out-diffusion of S/D region 124's n-type dopants towards fin structure 108 (discussed below). In some embodiments, first layer 124A can be made of a semiconductor material that has a lattice constant less than or substantially equal to the lattice constant of FET 101's channel region, such that first layer 124A can induce a tensile stress in FET 101's channel region to boost FET 101's electron mobility. For example, FET 101's channel region (e.g., portions of fin structure 108 traversed by gate structure 110) and first layer 124A can be made of silicon. In some embodiments, FET 101's channel region (e.g., portions of fin structure 108 traversed by gate structure 110) can be made of silicon, and first layer 124A can be made of a semiconductor material free from germanium or free from silicon germanium (e.g., first layer 124A does not contain germanium and/or silicon germanium) to avoid inducing a compressive stress in FET 101's channel region to degrade FET 101's electron mobility.

First layer 124A can have a vertical (e.g., in the z-direction) thickness $d_{124A}$ over a top surface $108_T$ of portions of fin structure 108 that are laterally (e.g., in the x-direction) outside gate structure 110. First layer 124A can further have a lateral (e.g., in the x-direction) thickness $t_{124A}$ over a side surface 125 of portions of fin structure 108 that are traversed by gate structure 110 (e.g., side surface 125 belongs to FET 101's channel region's side surface). In some embodiments, vertical thickness $d_{124A}$ can be greater than or substantially equal to lateral thickness $t_{124A}$, where top surface $108_T$ can be substantially parallel to a (100) crystalline plane. In some embodiments, vertical thickness $d_{124A}$ and lateral thickness $t_{124A}$ can be substantially equal to each other. In some embodiments, each of vertical thickness $d_{124A}$ and lateral thickness $t_{124A}$ can be from about 3 nm to about 20 nm, from about 4 nm to about 15 nm, or from about 5 nm to about 10 nm. If each of vertical thickness $d_{124}$ and lateral thickness $t_{124A}$ is below the above-noted lower limit, first layer 124A may not be able to block the out-diffusion of second layer 124B's dopant, thus causing a short channel effect in FET 101 (discussed below). If each of vertical thickness $d_{124}$ and lateral thickness $t_{124A}$ is beyond the above-noted upper limit, FET 101 may be susceptible to high contact resistance due to lower dopant activation efficiency of first layer 124A (discussed below).

S/D region 124 can further include a second layer 124B formed over and physically contact with first layer 124A along a junction 124S. Second layer 124B can be an n-type semiconductor material that provides electrons to FET 101's channel region. Further, second layer 124B can reduce FET 101's contact resistance by providing high activated carriers (e.g., high electron concentrations) to FET 101's channel region. In some embodiments, second layer 124B can be made of a semiconductor material that has a lattice constant less than or substantially equal to the lattice constant of FET 101's channel region, such that second layer 124B can induce a tensile stress in FET 101's channel region to boost FET 101's electron mobility. For example, FET 101's channel region (e.g., portions of fin structure 108 traversed by gate structure 110) and second layer 124B can be made of silicon. In some embodiments, FET 101's channel region (e.g., portions of fin structure 108 traversed by gate structure 110) can be made of silicon, and second layer 124B can be made of a semiconductor material free from germanium or free from silicon germanium (e.g., first layer 124A does not contain germanium and/or silicon germanium) to avoid inducing a compressive stress in FET 101's channel region to degrade FET 101's electron mobility. In some embodiments, first layer 124A and second layer 124B can be made of identical semiconductor materials. In some embodiments, first layer 124A and second layer 124B can be substantially coplanar with each other. In some embodiments, first layer 124A, second layer 124B, and fin structure 108 can be substantially coplanar with each other.

Second layer 124B can have a suitable vertical (e.g., in the z-direction) thickness $d_{124B}$, such as from about 50 nm to about 100 nm, over first layer 124A and over top surface $108_T$ of portions of fin structure 108 that are laterally (e.g., in the x-direction) outside gate structure 110. In some embodiments, second layer 124B's vertical thickness $d_{124B}$ can be greater than first layer 124A's vertical thickness $d_{124A}$. In some embodiments, a ratio of second layer 124B's vertical thickness $d_{124B}$ to first layer 124A's vertical thickness $d_{124A}$ can be from about 5 to about 15. If the ratio of second layer 124B's vertical thickness $d_{124B}$ to first layer 124A's vertical thickness $d_{124A}$ is below the above-noted lower limit, S/D region 124 may not provide sufficient contact area to reduce FET 101's contact resistance. If the ratio of second layer 124B's vertical thickness $d_{124B}$ to first layer 124A's vertical thickness $d_{124A}$ is beyond the above-noted upper limit, semiconductor device 100 may not meet the fin pitch requirement determined by the respective technology node (e.g., fin pitch may be required to be less than about 60 nm for a 22 nm technology node).

Second layer 124B can further have a suitable lateral (e.g., in the x-direction) thickness $t_{124B}$, such as from about 20 nm to about 100 nm, over first layer 124A and over side surface 125 of portions of fin structure 108 that are traversed by gate structure 110 (e.g., side surface 125 belongs to FET 101's channel region's side surface). In some embodiments, second layer 124B's vertical thickness $d_{124B}$ can be greater than first layer 124A's vertical thickness $d_{124A}$. In some embodiments, a ratio of second layer 124B's lateral thickness $t_{124B}$ to first layer 124A's lateral thickness $t_{124A}$ can be from about 5 to about 15. If the ratio of second layer 124B's lateral thickness $t_{124B}$ to first layer 124A's lateral thickness $t_{124A}$ is below the above-noted lower limit, S/D region 124 may not provide sufficient contact area to reduce FET 101's contact resistance. If the ratio of second layer 124B's lateral thickness $t_{124B}$ to first layer 124A's lateral thickness $t_{124A}$ is beyond the above-noted upper limit, semiconductor device 100 may not meet the fin pitch requirement determined by the respective technology node (e.g., fin pitch may be required to be less than about 60 nm for a 22 nm technology node).

Referring to FIG. 3, since first layer 124A can reduce FET 101's short channel effect by reducing the out-diffusion of S/D region 124's n-type dopants (discussed below). In some embodiments, S/D region 124 can be further formed through fin structure 108. Accordingly, S/D region 124's volume can be expanded to provide a lower contact resistance for FET 101, as compared to FIG. 2. In some embodiments, a ratio of S/D region 124's vertical height (e.g., sum of thicknesses $d_{124A}$ and $d_{124}$) to fin structure 108's height $H_{108}$ can be from about 0.8 to about 1.3. If the ratio of S/D region 124's vertical height (e.g., sum of thicknesses $d_{124A}$ and $d_{124B}$) to fin structure 108's height $H_{108}$ is below the above-noted lower limit, S/D region 124 may not provide sufficient contact area to reduce FET 101's contact resistance. If the ratio of S/D region 124's vertical height (e.g., sum of thicknesses $d_{124A}$ and $d_{124B}$) to fin structure 108's height $H_{108}$ is beyond the above-noted upper limit, gate structure 110 may not provide sufficient channel modulation on FET 101's channel region proximate to S/D region 124's bottom, thus causing a short channel effect in FET 101.

Referring to FIGS. 2 and 4, first layer 124A can be doped with a first n-type dopant (FIG. 4's doping profile 402). The first n-type dopant doped in first layer 124A can have a reduced out-diffusion towards fin structure 108, and the second n-type dopant doped in second layer 124B can provide high activated carrier concentrations (e.g., electron concentrations) to fin structure 108. Further, the first n-type dopant doped in first layer 124A can reduce the second n-type dopants out-diffusing from second layer 124B towards fin structure 108. In some embodiments, the first and second n-type dopants can include group-V elements, where the atomic mass of first n-type dopants can be greater than that of the second n-type dopants. For example, the first n-type dopant can include arsenic, and the second n-type dopant can include phosphorus. In some embodiments, the first n-type dopant can include a non-group-V element, and the second n-type dopant can include a group-V element. For example, the first n-type dopant can include carbon, and the second n-type dopant can include phosphorus or arsenic.

As shown in FIG. 4, doping profile 402 can have an initial doping concentration $N_0$ in first layer 124A and proximate to fin structure 108's side surface 125. Initial doping concentration $N_0$ can be determined to reduce FET 101's short channel effect. In some embodiments, initial doping concentration $N_0$ can be less than about $1 \times 10^{21}/cm^3$. If initial doping concentration $N_0$ is beyond the above-noted upper limit, the first n-type dopant may out-diffuse from first layer 124A towards fin structure 108, thus causing a short channel effect in FET 101. Doping profile 402 can further include a doping peak 127 in first layer 124A and proximate to junction 124S (e.g., proximate to second layer 124B). Doping peak 127 can be a diffusion barrier to block the out-diffusion of the second n-type dopant out-diffusing from second layer 124B towards fin structure 108. Doping peak 127 can include a maximum doping concentration $N_{peak}$ greater than initial doping concentration $N_0$ in first layer 124A. In some embodiments, doping peak 127's maximum doping concentration $N_{peak}$ can be greater than about $3 \times 10^{21}/cm^3$. If doping peak 127's maximum doping concentration $N_{peak}$ is less than the above-noted lower limit, doping peak 127 may not block the second n-type dopant out-diffusing from second layer 124B towards fin structure 108, thus causing a short channel effect in FET 101. In some embodiments, a ratio of maximum doping concentration $N_{peak}$ to initial doping concentration $N_0$ can be greater than 2. If the ratio of maximum doping concentration $N_{peak}$ to initial doping concentration $N_0$ is below the above-noted lower limit, doping peak 127 may not block the second n-type dopant out-diffusing from second layer 124B towards fin structure 108, thus causing a short channel effect in FET 101.

Doping peak 127 can further include a bandwidth $BW_{50}$ defined by a full width of doping peak 127 at a middle concentration $N_{50}$. In some embodiments, the term "middle concentration $N_{50}$" can refer to a doping concentration that is greater than initial doping concentration $N_0$ by about 50% of the difference between maximum doping concentration $N_{peak}$ and initial doping concentration $N_0$ (e.g., $N_{50}$ can be about equal to $N_0+0.5 \times (N_{peak}-N_0)$). To avoid the first n-type dopant out-diffusing towards fin structure 108, doping peak 127 can occupy a minimum portion of first layer 124A. For example, doping peak 127's bandwidth $BW_{50}$ can be less than a suitable full width, such as less than about 5 nm, to prevent the first n-type dopant from out-diffusing towards fin structure 108. In some embodiments, a ratio of doping peak 127's bandwidth $BW_{50}$ to first layer 124A's lateral thickness $t_{124A}$ can be from about 0.1 to about 0.3. If the ratio of doping peak 127's bandwidth $BW_{50}$ to first layer 124A's lateral thickness $t_{124A}$ is beyond the above-noted upper limit, doping peak 127 may be too close to side surface 125, thus causing the first n-type dopant from out-diffusing towards fin structure 108 and causing a short channel effect in FET 101. If the ratio of doping peak 127's bandwidth $BW_{50}$ to first layer 124A's lateral thickness $t_{124A}$ is below the above-noted lower limit, doping peak 127t may not block the second n-type dopant out-diffusing from second layer 124B towards fin structure 108, thus causing a short channel effect in FET 101.

Doping peak 127 can further include a bandwidth $BW_{10}$ defined by a full width of doping peak 127 at an edge concentration $N_{10}$. In some embodiments, the term "edge concentration $N_{10}$" can refer to a doping concentration that is greater than initial doping concentration $N_0$ by about 10% of the difference between maximum doping concentration $N_{peak}$ and initial doping concentration $N_0$ (e.g., $N_{10}$ can be about equal to $N_0+0.1\times(N_{peak}-N_0)$). To avoid the first n-type dopant out-diffusing towards fin structure 108, doping peak 127 can occupy a minimum portion of first layer 124A. For example, doping peak 127's bandwidth $BW_{10}$ can be less than a suitable full width, such as less than about 3 nm to prevent the first n-type dopant from out-diffusing towards fin structure 108. In some embodiments, a ratio of doping peak 127's bandwidth $BW_{10}$ to first layer 124A's lateral thickness $t_{124A}$ can be from about 0.3 to about 0.6. If the ratio of doping peak 127's bandwidth $BW_{10}$ to first layer 124A's lateral thickness $t_{124A}$ is beyond the above-noted upper limit, doping peak 127 may be too close to side surface 125, thus causing the first n-type dopant from out-diffusing towards fin structure 108 and causing a short channel effect in FET 101. If the ratio of doping peak 127's bandwidth $BW_{10}$ to first layer 124A's lateral thickness $t_{124A}$ is below the above-noted lower limit, doping peak 127 may not block the second n-type dopant out-diffusing from second layer 124B towards fin structure 108, thus causing a short channel effect in FET 101.

Doping peak 127 can be positioned away from fin structure 108's side surface 125 to reduce the out-diffusion of the first n-type dopant towards fin structure 108. For example, doping peak 127's maximum doping concentration $N_{peak}$ can be separated from side surface 125 by a separation $D_{peak}$, where a ratio of separation $D_{peak}$ to lateral thickness $t_{124A}$ can be from about 0.6 to about 0.8. If the ratio of separation $D_{peak}$ to lateral thickness $t_{124A}$ is below the above-noted lower limit, doping peak 127 may be too close to side surface 125, thus causing the first n-type dopant from out-diffusing towards fin structure 108 and causing a short channel effect in FET 101. If the ratio of separation $D_{peak}$ to lateral thickness $t_{124A}$ is beyond the above-noted upper limit, doping peak 127 may not have sufficient bandwidths $BW_{50}$ and/or $BW_{50}$ to prevent the first n-type dopant from out-diffusing towards fin structure 108, thus causing a short channel effect in FET 101. In some embodiments, doping concentration $N_p a$ can be closer to junction 124S than side surface 125 (e.g., $D_{peak}$ can be greater than $t_{124A}-D_{peak}$).

In some embodiments, one of doping peak 127's middle concentrations $N_{50}$ can be proximate to and separated from side surface 125 by a separation $D_{50}$, where a ratio of separation $D_{50}$ to lateral thickness $t_{124A}$ can be from about 0.5 to about 0.8. If the ratio of separation $D_{50}$ to lateral thickness $t_{124A}$ is below the above-noted lower limit, doping peak 127 may be too close to side surface 125, thus causing the first n-type dopant from out-diffusing towards fin structure 108 and causing a short channel effect in FET 101. If the ratio of separation $D_{50}$ to thickness $t_{124A}$ is beyond the above-noted upper limit, doping peak 127 may not have a sufficient bandwidth $BW_{50}$ to prevent the first n-type dopant from out-diffusing towards fin structure 108, thus causing a short channel effect in FET 101.

In some embodiments, one of doping peak 127's edge concentrations $N_{10}$ can be proximate to and separated from side surface 125 by a separation $D_{10}$, where a ratio of separation $D_{10}$ to lateral thickness $t_{124A}$ can be from about 0.4 to about 0.9. If the ratio of separation $D_{10}$ to lateral thickness $t_{124A}$ is below the above-noted lower limit, doping peak 127 may be too close to side surface 125, thus causing the first n-type dopant from out-diffusing towards fin structure 108 and causing a short channel effect in FET 101. If the ratio of separation $D_{10}$ to lateral thickness $t_{124A}$ is beyond the above-noted upper limit, doping peak 127 may not have a sufficient bandwidth $BW_{50}$ to prevent the first n-type dopant from out-diffusing towards fin structure 108, thus causing a short channel effect in FET 101.

As previously discussed, doping profile 402 can include initial doping concentration No proximate to fin structure 108 and doping peak 127 proximate to second layer 124B. Since doping peak 127 can have a narrow full width (e.g., narrow bandwidths $BW_{50}$ and/or $BW_{10}$) to prevent the first and second n-type dopants from out-diffusing towards fin structure 108, the first n-type dopant's doping profile can have multiple doping gradients to increase the doping concentration from initial doping concentration $N_0$ to maximum doping concentration $N_{peak}$. For example, as shown in FIG. 4, the first n-type dopant's doping profile in S/D region 124 can have a first doping gradient $S_{127A}$ that increases the first n-type dopant's doping concentration from initial doping concentration $N_0$ to edge concentration $N_{10}$ within first layer 124A. The first n-type dopant's doping profile in S/D region 124 can further have a second doping gradient $S_{127B}$ that increases the first n-type dopant's doping concentration from edge concentration $N_{10}$ to peak doping concentration $N_{peak}$ within first layer 124A. Second doping gradient $S_{127B}$ can be greater (e.g., steeper) than first doping gradient $S_{127A}$ to provide the narrow full width (e.g., the previously discussed bandwidths $BW_{50}$ and/or $BW_{10}$) to prevent the first and second n-type dopants from out-diffusing towards fin structure 108.

Referring to FIGS. 2 and 4, second layer 124B can be doped with a second n-type dopant (FIG. 4's doping profile 404). Doping profile 404 can include a doping peak 129 in second layer 124B. Doping peak 129 can include a suitable maximum doping concentration $N_{124B}$, such as greater than about $2\times10^{21}/cm^3$, in second layer 124B to lower contact resistance for FET 101. If doping concentration $N_{124B}$ is below the above-noted lower limit, FET 101 may be susceptible to high contact resistance. In some embodiments, doping concentration $N_{124B}$ can be less than or substantially equal to doping peak 127's maximum doping concentration $N_{peak}$ to prevent the second n-type dopant from out-diffusing through first layer 124A towards fin structure 108. In some embodiments, since doping peak 127 in first layer 124A can prevent the out-diffusion of the second n-type dopants as previously discussed, the second n-type dopant can have a concentration less than the first n-type dopant's concentration, such as less than maximum concentration $N_{peak}$, less than middle concentration $N_{50}$, less than edge concentration $N_{10}$, and less than initial concentration NO, in first layer 124A.

In some embodiments, referring to FIGS. 4 and 5, since first layer 124A can be formed vertically (e.g., in the z-direction) under second layer 124B, the above-discussed FIG. 4's doping profile's characteristics (e.g., doping concentrations, doping gradients, doping peak's positions, and doping peak's bandwidths) with respect to lateral thickness $t_{124}$ can be applied to the respective FIG. 5's doping profile's characteristics with respect to vertical thickness $d_{124}$.

Referring to FIG. 2, semiconductor device 100 can further include an interlayer dielectric (ILD) layer 130 to provide electrical isolation to structural elements it surrounds or covers, such as gate structure 110 and S/D regions 124. ILD layer 130 can include any suitable dielectric material to provide electrical insulation, such as silicon oxide, silicon dioxide, silicon oxycarbide, silicon oxynitride, silicon oxycarbon nitride, and silicon carbonitride. ILD layer 130 can have any suitable thickness, such as from about 50 nm to about 200 nm, to provide electrical insulation. Based on the disclosure herein, other insulating materials and thicknesses for ILD layer 130 are within the scope and spirit of this disclosure.

Semiconductor device 100 can further include a layer of insulating material 148 formed over gate structure 110 and ILD layer 130. Layer of insulating material 148 can electrically isolate gate structure 110 and S/D region 124 from an interconnect structure (not shown in FIGS. 1-3) formed over FET 101. Layer of insulating material 148 can be made of any suitable insulating material, such as silicon oxide, silicon nitride, a low-k dielectric material, and a high-k dielectric material. Further, layer of insulating material 148 can be made of any suitable thickness, such as from about 10 nm to about 400 nm, that can provide sufficient electrical insulation between FETs 101 and the interconnect structure (not shown in FIGS. 1-3) formed over FETs 101. Based on the disclosure herein, other insulating materials and thicknesses for layer of insulating material 148 are within the scope and spirit of this disclosure.

Semiconductor device 100 can further include a trench conductor structure 150 formed through layer of insulating material 148. Trench conductor structure 150 can electrically connect FET 101's S/D region 124 to the interconnect structure (not shown in FIGS. 1-3) formed over FET 101. In some embodiments, trench conductor structure 150 can connect FET 101's gate structure 110 to the interconnect structure formed over FET 101. In some embodiments, trench conductor structure 150 can protrude into S/D region 124. For example, trench conductor structure 150 can include a silicide layer 152 protruding into S/D region 124 and a layer of conductive material 154 formed over silicide layer 152. Silicide layer 152 can include a metal silicide material to provide a low resistance interface between layer of conductive material 154 and SID region 124. In some embodiments, silicide layer 152 can be formed protruding into second layer 124B. In some embodiments, silicide layer 152 can be formed protruding into first layer 124A and second layer 124B. Silicide layer 152 can be a metal silicide that can include titanium, cobalt, nickel, platinum, palladium, tungsten, molybdenum, tantalum, vanadium, chromium, silicon, or germanium. Layer of conductive material 154 can include any suitable conductive material that provides low resistance between silicide layer 152 and the interconnect structure (not shown in FIGS. 1-3) formed over FET 101. For example, layer of conductive material 154 can include a metallic material, such as copper, tungsten, aluminum, and cobalt. In some embodiments, layer of conductive material 154 can further include a stack of conductive materials (not shown in FIGS. 1-3), such as a conductive nitride material (e.g., titanium nitride or tantalum nitride), that can act as a diffusion barrier, an adhesion promotion layer, or a nucleation layer to embed the above-noted metallic materials in layer of insulating material 148. Based on the disclosure herein, other materials for silicide layer 152 and layer of conductive material 154 are within the scope and spirit of this disclosure.

Figure 6:
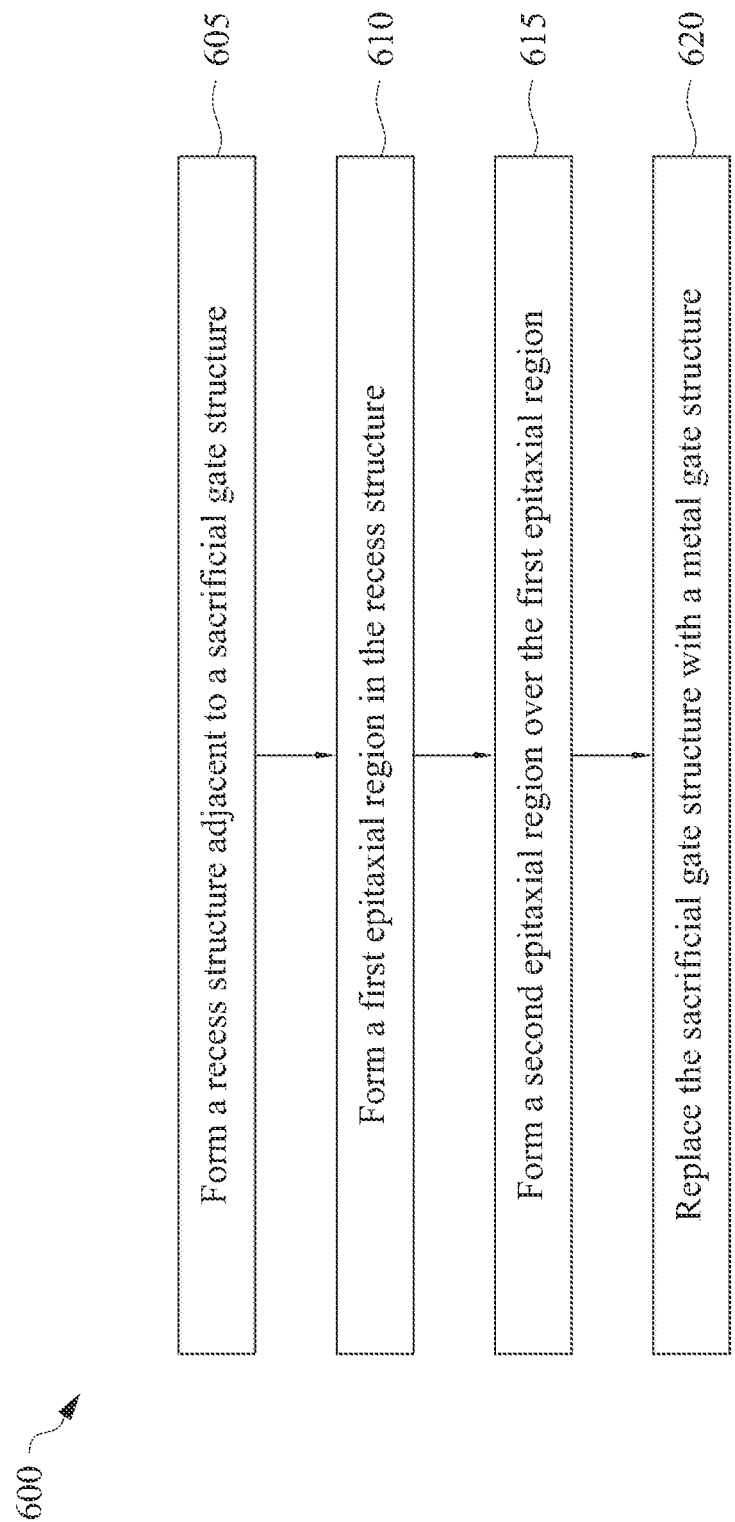
FIG. 6 illustrates a flow diagram of a method for fabricating a semiconductor device, according to some embodiments.
Figures 11, 12:
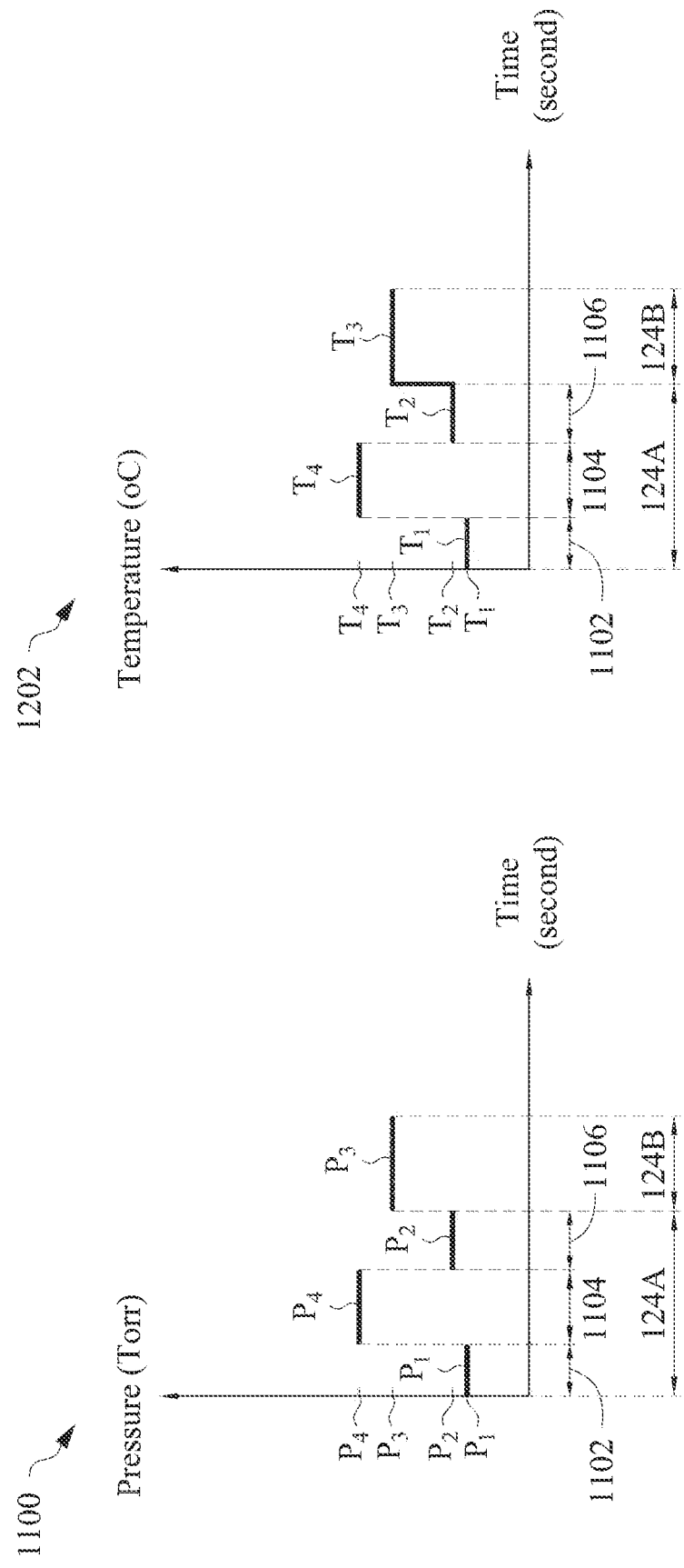
FIG. 11 illustrates a growth pressure for fabricating a semiconductor device, according to some embodiments.
FIG. 12 illustrates a growth temperature for fabricating a semiconductor device, according to some embodiments.
Figure 13:
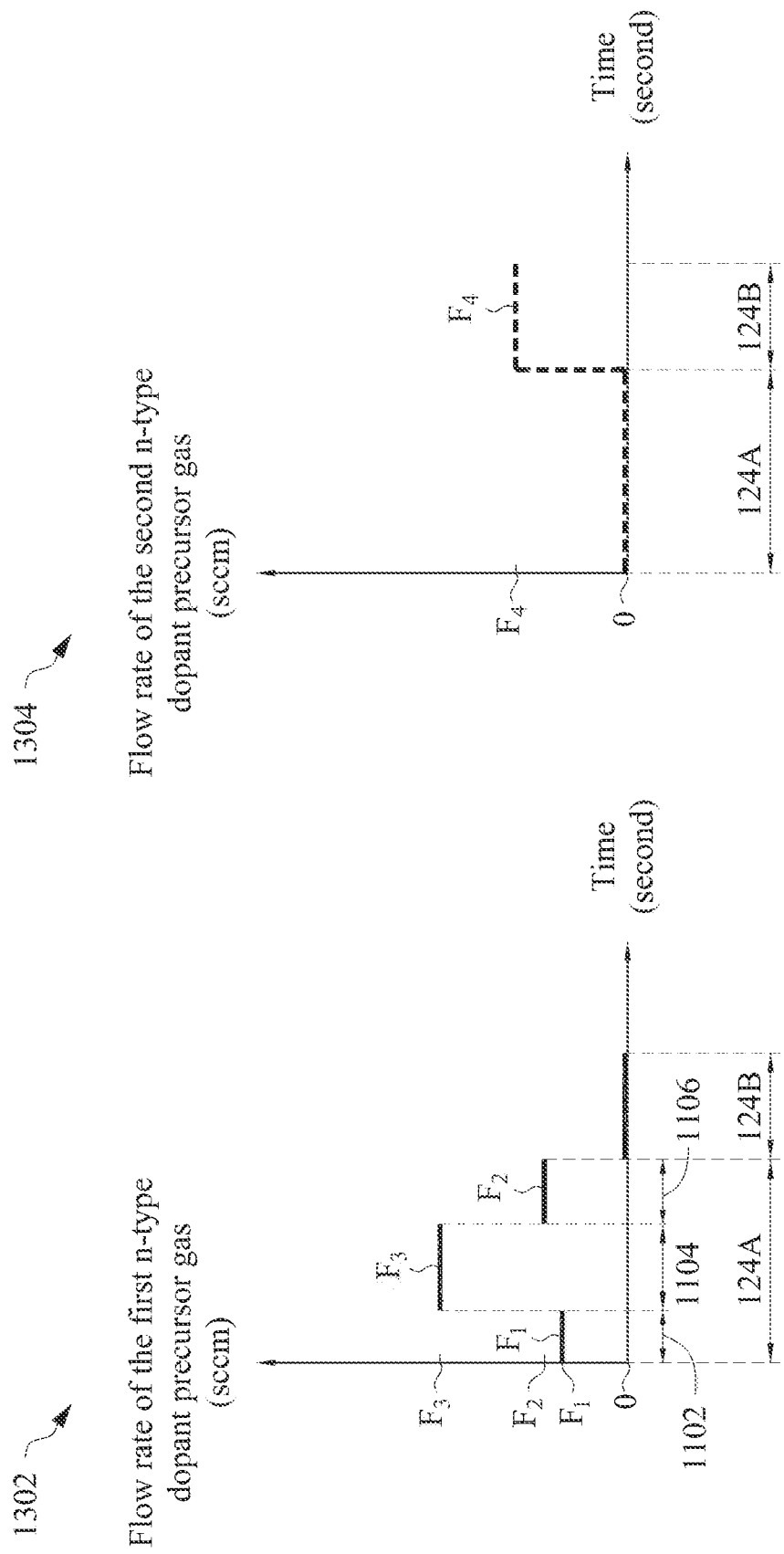
FIG. 13 illustrates a dopant precursor gas flow for fabricating a semiconductor device, according to some embodiments.
Figure 14:
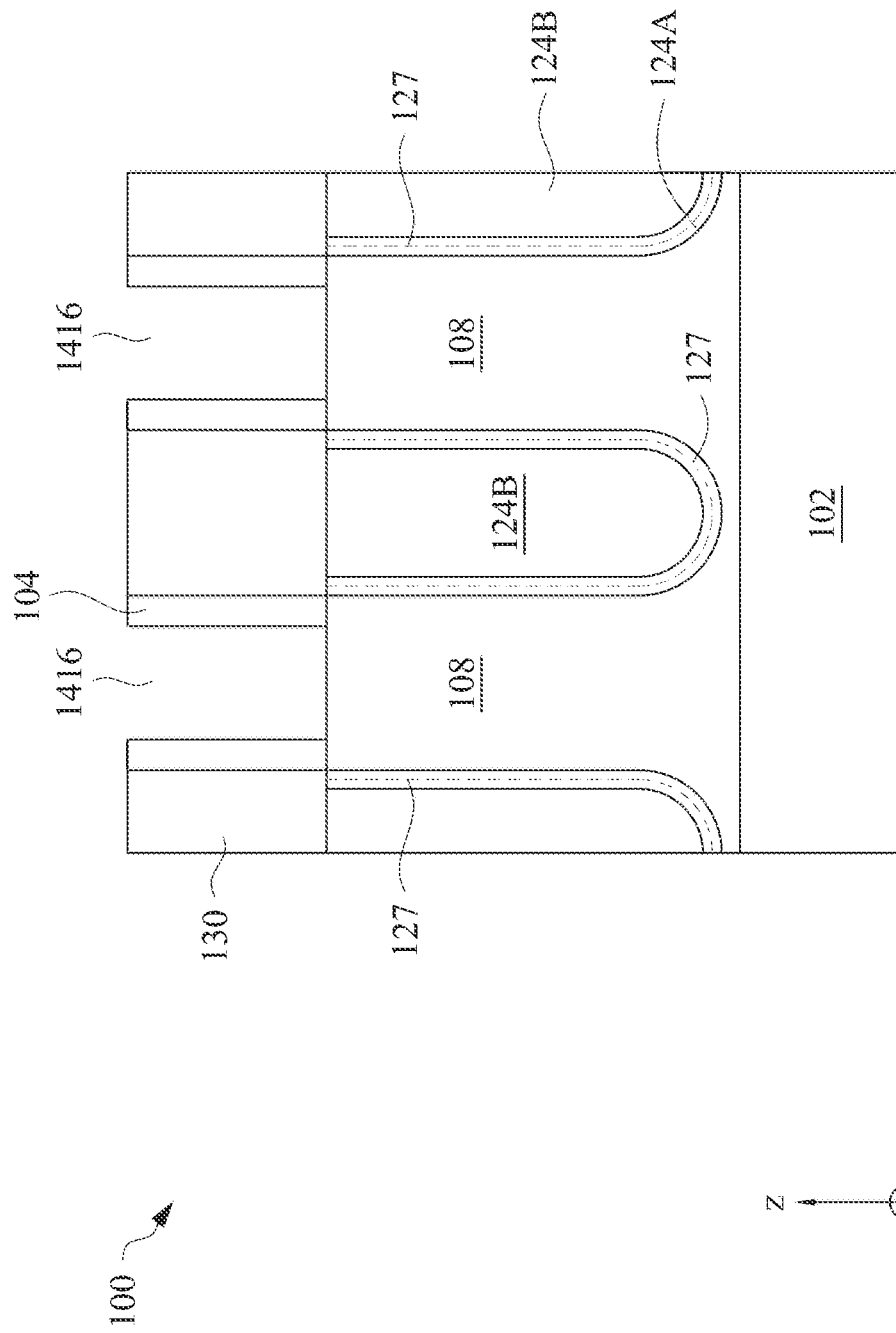
FIGS. 14 and 15 illustrate cross-sectional views of a semiconductor device at various stages of its fabrication process, according to some embodiments.
Figure 15:
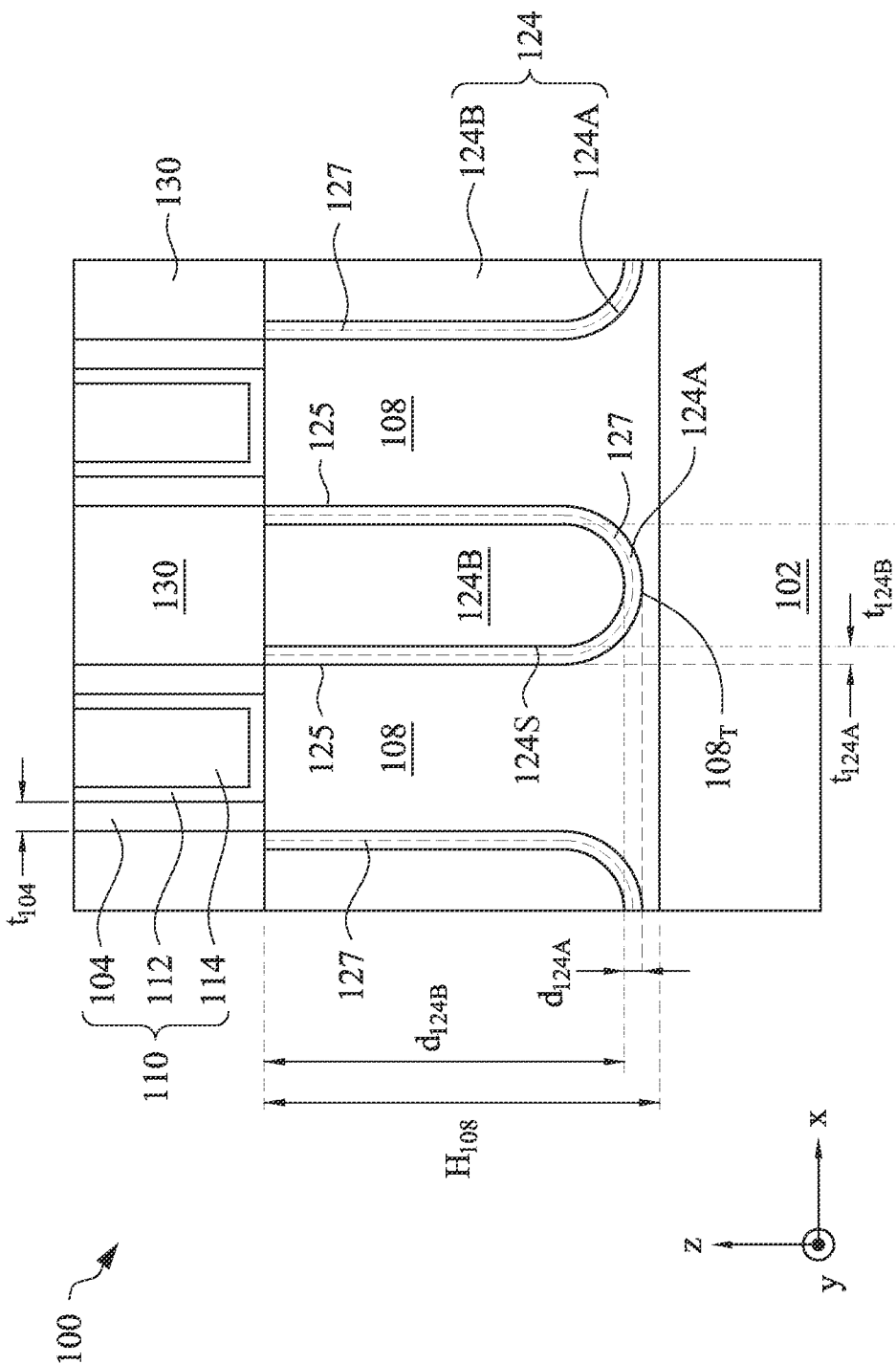

FIG. 6 is a flow diagram of a method 600 for fabricating semiconductor device 100, according to some embodiments. For illustrative purposes, the operations illustrated in FIG. 6 will be described with reference to the example fabrication process for fabricating semiconductor device 100 as illustrated in FIGS. 7-15. FIGS. 8-10, 14, and 15 illustrate cross-sectional views along line B-B of structure of FIG. 1 at various stages of its fabrication, according to some embodiments. FIG. 11 illustrates a growth pressure profile for epitaxially growing S/D region 124 in method 600, according to some embodiments. FIG. 12 illustrates a growth temperature profile for epitaxially growing S/D region 124 in method 600, according to some embodiments. FIG. 13 illustrates the flow rate profiles of dopant processing gases for epitaxially growing S/D region 124 in method 600, according to some embodiments. Operations can be performed in a different order or not performed depending on specific applications. Method 600 may not produce a complete semiconductor device 100. Accordingly, it is understood that additional processes can be provided before, during, and/or after method 600, and that some other processes may be briefly described herein. Further, the discussion of elements in FIGS. 1-15 with the same annotations applies to each other, unless mentioned otherwise.

Referring to FIG. 6, in operation 605, a recess structure is formed adjacent to a sacrificial gate structure. For example, a recess structure 836 (shown in FIG. 8) can be formed over in fin structure 108 and adjacent to a sacrificial gate structure 710 with references to FIGS. 7 and 8. The process of forming recess structure 836 can include (i) forming fin structures 108 (shown in FIG. 7) over substrate 102; (ii) forming sacrificial gate structures 710 (shown in FIG. 7) over fin structures 108; and (iii) removing fin structures 108 through sacrificial gate structures 710 to form recess structure 836 (shown in FIG. 8).

Figure 7:
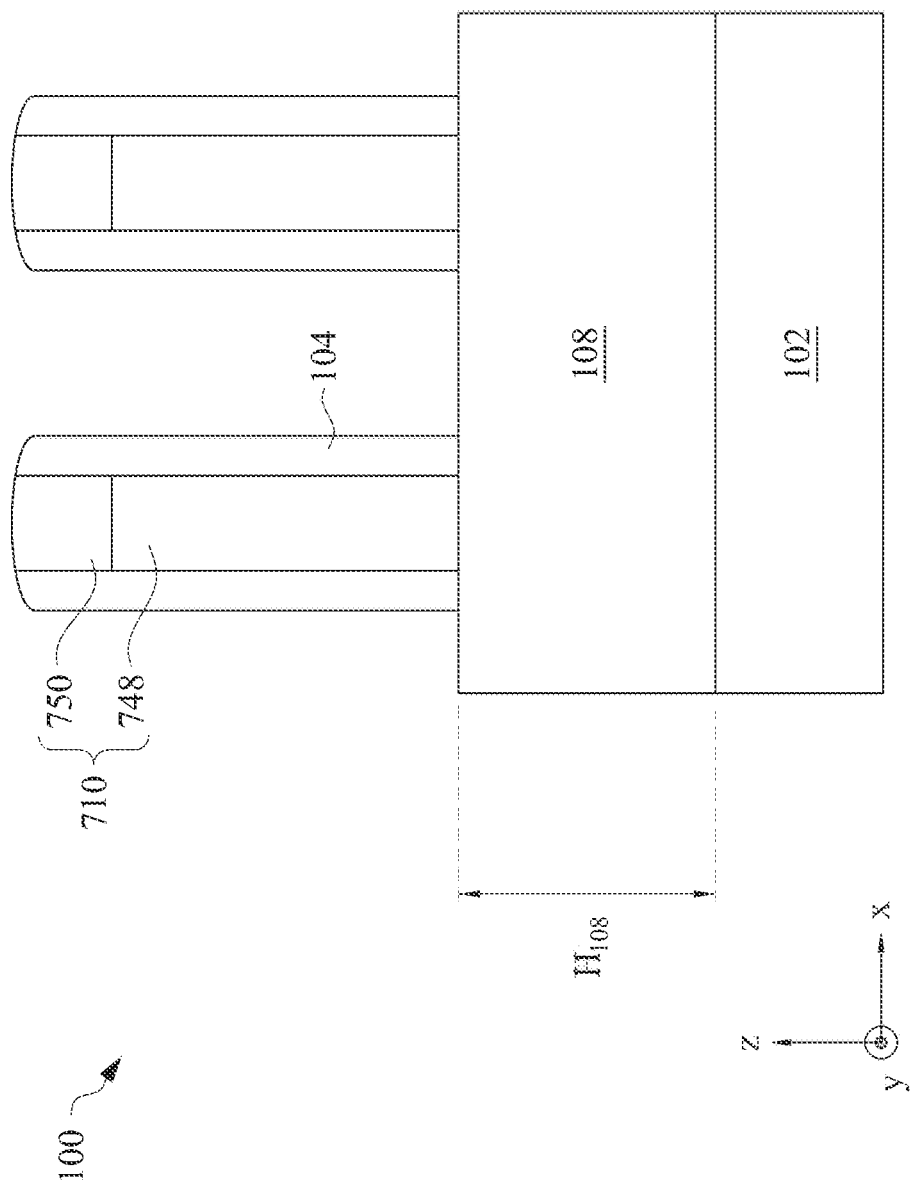
FIGS. 7-10 illustrate cross-sectional views of a semiconductor device at various stages of its fabrication process, according to some embodiments.

Referring to FIG. 7, the process of forming fin structures 108 can include (i) providing substrate 102; (ii) etching substrate 102 with an etching depth substantially equal to height $H_{108}$ through a patterned mask layer (not shown in FIG. 7) using a dry etch process and/or a wet etch process; and (iii) forming STI region 138 over the etched substrate 102 using a deposition process and an etch back process. Based on the disclosure herein, other processes for forming fin structures 108 are within the spirit and scope of this disclosure.

The process of forming sacrificial gate structure 710 can include (i) blanket depositing a polysilicon layer 748 and a hard mask layer 750 over fin structures 108 using a suitable deposition process, such as a chemical vapor deposition (CVD) process, a physical vapor deposition (PVD) process, and an atomic layer deposition (ALD) process; (ii) removing polysilicon layer 748 and hard mask layer 750 through a patterned mask layer (not shown in FIG. 7) using an etching process; and (iii) forming gate spacers 104 with thickness $t_{104}$ over sidewalls of polysilicon layer 748 using a suitable deposition process and an etch process. Based on the disclosure herein, other processes for forming sacrificial gate structures 710 are within the spirit and scope of this disclosure.

Figure 8:
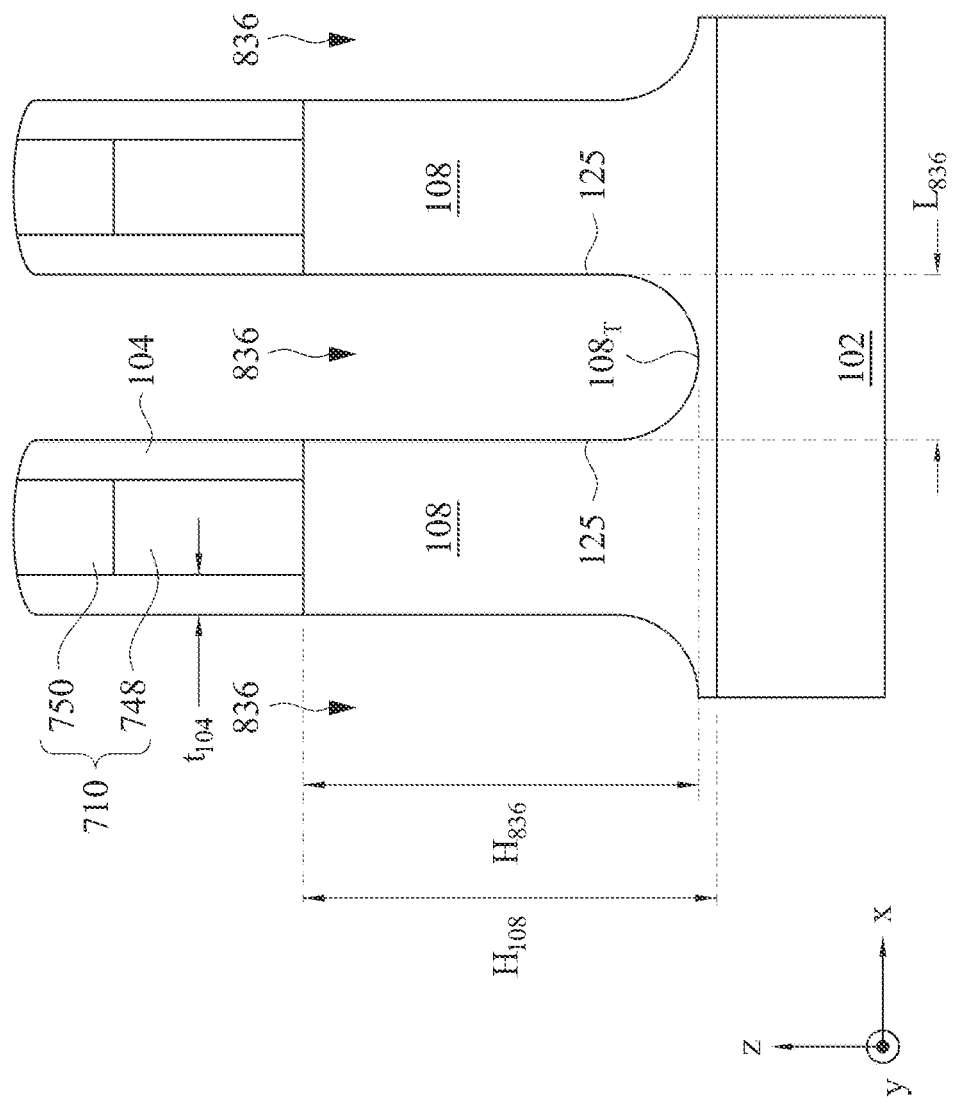

Referring to FIG. 8, after forming sacrificial gate structure 710, recess structure 836 can be formed by etching fin structures 108 through sacrificial gate structures 710 using an etching process. The etching process can include a dry etch process or a wet etch process. In some embodiments, the etching process can be a time-etch process. In some embodiments, the dry etch process can include using any suitable etchant, such as an oxygen-containing gas, a fluorine-containing gas, a chlorine-containing gas, and a bromine-containing gas, and the wet etch process can include etching in any suitable wet etchant, such as diluted hydrofluoric acid, potassium hydroxide solution, ammonia, and nitric acid. The resulting recess structure 836 can expose two opposite side surfaces 125 horizontally (e.g., in the x-direction) separated by a length $L_{836}$. Further, the resulting recess structure 836 can protrude into fin structure 108 with a depth $H_{836}$ to define top surface $108_T$ of portions of fin structure 108 that are laterally (e.g., in the x-direction) outside sacrificial gate structure 310. In some embodiments, length $L_{836}$ can be any suitable dimension, such as from about 10 nm to about 30 nm, associated with semiconductor device 100's technology node (e.g., fin pitch may be required to be less than about 60 nm for a 22 nm technology node). In some embodiments, depth $H_{436}$ can be substantially equal to the sum of first layer 124A's thickness $d_{124A}$ and second layer 124B's thickness $d_{124B}$.

Figure 9:
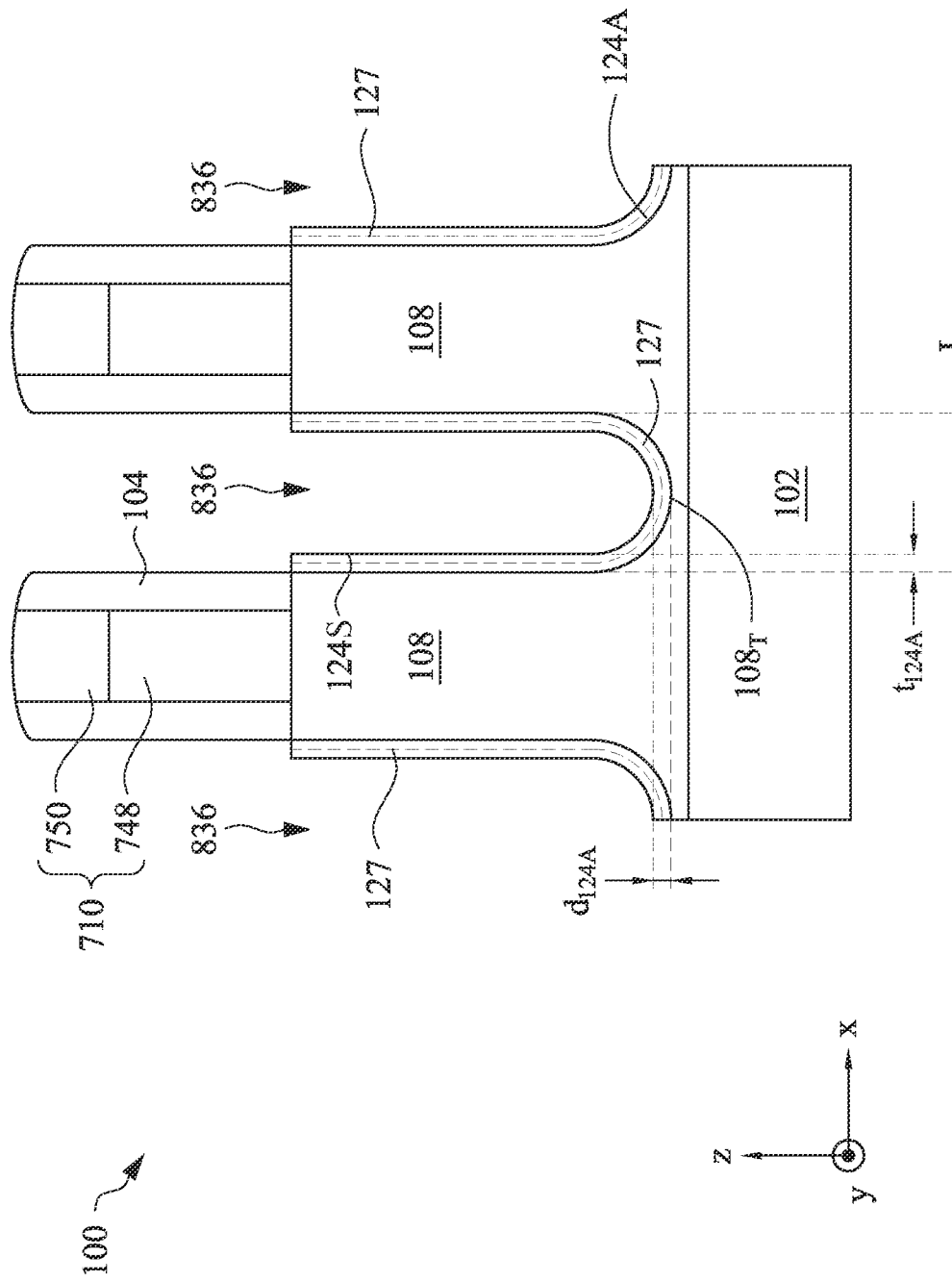
Figure 10:
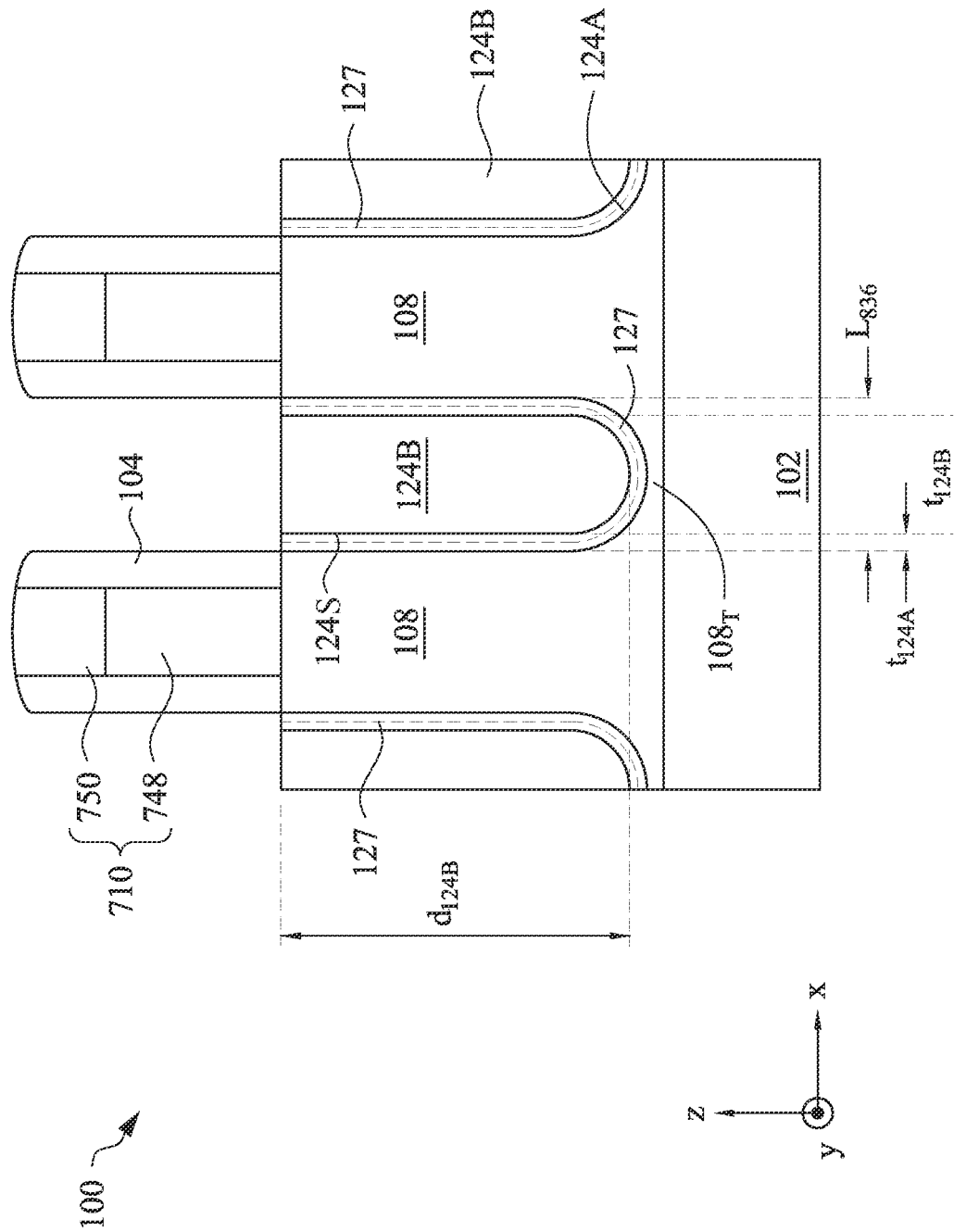

Referring to FIG. 6, in operation 610, a first epitaxial region is formed in the recess structure. For example, as shown in FIG. 9, first layer 124A with doping peak 127 can be formed in recess structure 836 with references to FIGS. 9 and 11-13. The process of forming first layer 124A can include performing an epitaxial growth process to epitaxially growing a semiconductor material of vertical thickness $d_{124A}$ measured from top surface 108$_T$. The epitaxial growth process can further define first layer 124A with lateral thickness $t_{124A}$ over side surfaces 125. The epitaxial growth process can further in-situ dope the first layer 124A with the first n-type dopants (discussed in FIG. 4) of doping profile 402 (shown in FIGS. 4 and 5). The epitaxial growth process can include (i) a CVD process, such as a low pressure CVD (LPCVD) process, a rapid thermal CVD (RTCVD) process, a metal-organic CVD (MOCVD) process, an atomic layer CVD (ALCVD) process, an ultrahigh vacuum CVD (UHVCVD) process, and a reduced pressure CVD (RPCVD) process; (ii) a molecular beam epitaxy (MBE) process; (iii) an epitaxial deposition/partial etch process, such as a cyclic deposition-etch (CDE) process; and (iv) a selective epitaxial growth (SEG) process. The epitaxial process can be performed using suitable processing gases associated with the semiconductor material of first layer 124A. For example, first layer 124A can include silicon, where the processing gases can include silane ($SiH_4$), disilane ($Si_2H_6$), dichlorosilane (DCS), hydrogen ($H_2$), or nitrogen ($N_2$).

Referring to FIG. 11, in some embodiments, the epitaxial growth process for in-situ doping first layer 124A can be performed using a growth pressure profile 1100 (e.g., a variable pressure mode). For example, the epitaxial growth process, configured with a variable pressure mode, for in-situ doping first layer 124A can be performed at a suitable growth pressure $P_1$, such as about 100 torr, over a time duration 1102. Growth pressure $P_1$ can at least determine doping profile 402's initial doping concentration $N_0$. For example, doping profile 402's initial doping concentration $N_0$ can be increased by increasing growth pressure $P_1$. In some embodiments, growth pressure $P_1$ can be substantially constant during time duration 1102.

The epitaxial growth process, configured with the variable pressure mode, for in-situ doping first layer 124A can be subsequently performed at a growth pressure $P_4$ over a time duration 1104, and at a growth pressure $P_2$ over a time duration 1106. Growth pressure $P_4$ can be greater than both growth pressures $P_1$ and $P_2$ to form doping peak 127 as described in FIGS. 4 and 5. In some embodiments, growth pressure $P_4$ can be greater than about 300 torr. If growth pressure $P_4$ is below the above-noted lower limit, doping peak 127 in first layer 124A may not provide sufficient maximum doping concentration $N_{peak}$ to prevent the second n-type dopant from out-diffusing from second layer 124B towards fin structure 108, thus causing a short channel effect in FET 101. In some embodiments, a ratio of growth pressure $P_4$ to growth pressure $P_1$ can be from about 3 to about 15. If the ratio of growth pressure $P_4$ to growth pressure $P_1$ is below the above-noted lower limit, doping peak 127 in first layer 124A may not provide sufficient maximum doping concentration $N_{peak}$ to prevent the second n-type dopant from out-diffusing from second layer 124B towards fin structure 108, thus causing a short channel effect in FET 101. If the ratio of growth pressure $P_4$ to growth pressure $P_1$ is beyond the above-noted upper limit, first layer 124A may not provide a sufficient amount of activated carriers (e.g., electrons) to reduce FET 101's contact resistance.

Growth pressure $P_2$ can be a suitable pressure between growth pressure $P_1$ and growth pressure $P_4$ to define peak 127's bandwidths $BW_{10}$ and/or $BW_{50}$. In some embodiments, growth pressure $P_2$ can be substantially equal to growth pressure $P_1$. In some embodiments, a ratio of growth pressure $P_4$ to growth pressure $P_2$ can be from about 1 to about 3. If the ratio of growth pressure $P_4$ to growth pressure $P_2$ is below the above-noted lower limit, doping peak 127 in first layer 124A may not provide sufficiently sharp bandwidth $BW_{50}$ and/or bandwidth $BW_{10}$ to prevent the second n-type dopant from out-diffusing towards fin structure 108, thus causing a short channel effect in FET 101. If the ratio of growth pressure $P_4$ to growth pressure $P_2$ is beyond the above-noted upper limit, first layer 124A may not provide a sufficient amount of activated carriers (e.g., electrons) to reduce FET 101's contact resistance.

Time duration 1102, such as from about 10 seconds to about 30 seconds, can at least determine doping profile 402's separation $D_{10}$, bandwidths $BW_{10}$ and/or $BW_{50}$. In some embodiments, separation $D_{10}$ can be increased by increasing time duration 1102. In some embodiments, a ratio of time duration 1102 to the sum of time durations 1102, 1104, and 1106 (e.g., the total growth time for growing first layer 124A) can be from about 0.2 to about 0.4. If the ratio of time duration 1102 to the sum of time durations 1102, 1104, and 1106 is beyond the above-noted upper limit, doping peak 127 in first layer 124A may not provide sufficient bandwidth $BW_{50}$ and/or bandwidth $BW_{10}$ to prevent the second n-type dopant from out-diffusing from second layer 124B towards fin structure 108, thus causing a short channel effect in FET 101. If the ratio of time duration 1102 to the sum of time durations 1102, 1104, and 1106 is below the above-noted lower limit, doping peak 127 may not have sufficient separation $D_{10}$ to separate doping peak 127 from fin structure 108, thus causing the first n-type dopant out-diffusing from first layer 124A towards fin structure 108.

Time duration 1104 can be less than time duration 1102 to achieve doping peak 127's bandwidth $BW_{50}$, bandwidth $BW_{50}$, and separations $D_{50}$ and $D_{peak}$ as previously discussed with respect to FIGS. 4 and 5. In some embodiments, time duration 1104 can be further less than time duration 1106. In some embodiments, a ratio of time duration 1104 to time duration 1102 can be from about 0.2 to about 0.6. If the ratio of time duration 1104 to time duration 1102 is below the above-noted lower limit, doping peak 127 in first layer 124A may not provide sufficient bandwidth $BW_{50}$ and/or bandwidth $BW_{10}$ to prevent the second n-type dopant from out-diffusing from second layer 124B towards fin structure 108, thus causing a short channel effect in FET 101. If the ratio of time duration 1104 to time duration 1102 is beyond the above-noted upper limit, doping peak 127 may not have sufficient separation $D_{50}$ to separate doping peak 127 from fin structure 108, thus causing the first n-type dopant out-diffusing from first layer 124A towards fin structure 108. In some embodiments, a ratio of time duration 1104 to the sum of time durations 1102, 1104, and 1106 (e.g., the total growth time for growing first layer 124A) can be from about 0.3 to about 0.5. If the ratio of time duration 1104 to the sum of time durations 1102, 1104, and 1106 is below the above-noted lower limit, doping peak 127 in first layer 124A may not provide sufficient bandwidth $BW_{50}$ and/or bandwidth $BW_{10}$ to prevent the second n-type dopant from out-diffusing from second layer 124B towards fin structure 108, thus causing a short channel effect in FET 101. If the ratio of time duration 1104 to the sum of time durations 1102, 1104, and 1106 is beyond the above-noted lower limit, doping peak 127 may not have sufficient separation $D_{50}$ to separate doping peak 127 from fin structure 108, thus causing the first n-type dopant out-diffusing from first layer 124A towards fin structure 108.

Time duration 1106 can at least determine the separation between doping peak 127 and junction 124S, as previously discussed with respect to FIGS. 4 and 5. In some embodiments, time duration 1106 can be less than time duration 1102 to allow doping peak 127 positioned proximate to junction 124S. In some embodiments, time duration 1106 can be substantially equal to zero to position doping peak 127's peak doping concentration $N_{peak}$ substantially proximate to junction 124S.

Referring to FIG. 12, in some embodiments, the epitaxial growth process for in-situ doping first layer 124A can be performed using growth temperature profile 1202 (e.g., a variable temperature mode). For example, the epitaxial growth process, configured with a variable temperature mode, for in-situ doping first layer 124A can be performed at a growth temperature $T_1$ over time duration 1102. Growth temperature $T_1$ can at least determine doping profile 402's initial doping concentration $N_0$. For example, doping profile 402's initial doping concentration $N_0$ can be increased by increasing growth temperature $T_1$. In some embodiments, growth temperature $T_1$ can be from about 600° C. to about 700° C. during time duration 1102. If growth temperature $T_1$ is below the above-noted lower limit, first layer 124A may not provide a sufficient amount of activated carriers (e.g., electrons) to reduce FET 101's contact resistance. If growth temperature $T_1$ is beyond the above-noted upper limit, the resulting initial doping concentration $N_0$ may be too high to cause the out-diffusion of the first n-type dopant towards fin structure 108. In some embodiments, growth temperature $T_1$ can be substantially constant during time duration 1102.

The epitaxial growth process, configured with the variable temperature mode, for in-situ doping first layer 124A can be subsequently performed at a growth temperature $T_4$ over time duration 1104, and at a growth temperature $T_2$ over time duration 1106. Growth temperature $T_4$ can be greater than both growth temperatures $T_1$ and $T_2$ to form doping peak 127 as described in FIGS. 4 and 5. In some embodiments, growth temperature $T_4$ can be greater than about 700° C. If growth temperature $T_4$ is below the above-noted lower limit, doping peak 127 in first layer 124A may not provide sufficient maximum doping concentration $N_{peak}$ to prevent the second n-type dopant from out-diffusing towards fin structure 108, thus causing a short channel effect in FET 101. In some embodiments, a ratio of growth temperature $T_4$ to growth temperature $T_1$ can be from about 1.05 to about 1.25. If the ratio of growth temperature $T_4$ to growth temperature $T_1$ is below the above-noted lower limit, doping peak 127 in first layer 124A may not provide sufficient maximum doping concentration $N_{peak}$ to prevent the second n-type dopant from out-diffusing towards fin structure 108, thus causing a short channel effect in FET 101. If the ratio of growth temperature $T_4$ to growth temperature $T_1$ is beyond the above-noted upper limit, first layer 124A may not provide a sufficient amount of activated carriers (e.g., electrons) to reduce FET 101's contact resistance.

Growth temperature $T_2$ can be a suitable temperature between growth temperature $T_1$ and growth temperature $T_4$ to define peak 127's bandwidths $BW_{10}$ and/or $BW_{50}$. In some embodiments, growth temperature $T_2$ can be substantially equal to growth temperature $T_1$.

Referring to FIG. 13, in some embodiments, the epitaxial growth process for in-situ doping first layer 124A can be performed by flowing a first n-type dopant precursor gas with flow rate profile 1302 (e.g., a variable flow-rate mode). The first n-type dopant precursor gas can include the first n-type dopant to dope first layer 124A. For example, as previously discussed, the first n-type dopant can be arsenic, where the respective first n-type dopant precursor gas can include arsine ($AsH_3$). In some embodiments, the first n-type dopant can be carbon, where the respective first n-type dopant precursor gas can include methane ($CH_4$). In some embodiments, the first n-type dopant precursor gas can be free from the second n-type dopant. For example, the second n-type dopant that dopes second layer 124B can include phosphorus, where the first n-type dopant precursor gas can be phosphorus-free (e.g., the first n-type dopant precursor gas's chemical formula does not contain phosphorus). The epitaxial growth process, configured with a variable flow-rate mode, for in-situ doping first layer 124A can be performed at a flow rate $F_1$ over time duration 1102. Flow rate $F_1$ can at least determine doping profile 402's initial doping concentration $N_0$. For example, doping profile 402's initial doping concentration $N_0$ can be increased by increasing flow rate $F_1$. In some embodiments, flow rate $F_1$ can be from about 200 standard cubic centimeters per minute (sccm) to about 300 sccm during time duration 1102. If flow rate $F_1$ is below the above-noted lower limit, first layer 124A may not provide a sufficient amount of activated carriers (e.g., electrons) to reduce FET 101's contact resistance. If flow rate $F_1$ is beyond the above-noted upper limit, the resulting initial doping concentration $N_0$ may be too high to cause the out-diffusion of the first n-type dopant towards fin structure 108. In some embodiments, flow rate $F_1$ can be substantially constant during time duration 1102.

The epitaxial growth process, configured with the variable temperature mode, for in-situ doping first layer 124A can be subsequently performed at a flow rate $F_3$ over time duration 1104, and at a flow rate $F_2$ over time duration 1106. Flow rate $F_4$ can be greater than both flow rates $F_1$ and $F_2$ to form doping peak 127 as described in FIGS. 4 and 5. In some embodiments, flow rate $F_3$ can be greater than about 500 sccm. If flow rate $F_3$ is below the above-noted lower limit, doping peak 127 in first layer 124A may not provide sufficient maximum doping concentration $N_{peak}$ to prevent the second n-type dopant from out-diffusing towards fin structure 108, thus causing a short channel effect in FET 101. In some embodiments, a ratio of flow rate $F_3$ to flow rate $F_1$ can be from about 1.5 to about 2.5. If the ratio of flow rate $F_3$ to flow rate $F_1$ is below the above-noted lower limit, doping peak 127 in first layer 124A may not provide sufficient maximum doping concentration $N_{peak}$ to prevent the second n-type dopant from out-diffusing towards fin structure 108, thus causing a short channel effect in FET 101. If the ratio of flow rate $F_3$ to flow rate $F_1$ is beyond the above-noted upper limit, first layer 124A may not provide a sufficient amount of activated carriers (e.g., electrons) to reduce FET 101's contact resistance.

Flow rate $F_2$ can be a suitable flow rate between flow rate $F_1$ and flow rate $F_3$ to define peak 127's bandwidths $BW_{10}$ and/or $BW_{50}$. In some embodiments, flow rate $F_2$ can be substantially equal to flow rate $F_1$. In some embodiments, a ratio of flow rate $F_3$ to flow rate $F_2$ can be from about 1.05 to about 1.5. If the ratio of flow rate $F_3$ to flow rate $F_2$ is below the above-noted lower limit, doping peak 127 in first layer 124A may not provide sufficiently sharp bandwidth $BW_{50}$ and/or bandwidth $BW_{10}$ to prevent the second n-type dopant from out-diffusing towards fin structure 108, thus causing a short channel effect in FET 101. If the ratio of flow rate $F_3$ to flow rate $F_2$ is beyond the above-noted upper limit, first layer 124A may not provide a sufficient amount of activated carriers (e.g., electrons) to reduce FET 101's contact resistance.

In some embodiments, the discussions (e.g., ranges and criticalities) of time durations 1102, 1104, 1106 of variable pressure mode can be applied to those of variable temperature mode and variable flow-rate mode.

In some embodiments, the epitaxial growth process for forming first layer 124A can be concurrently configured with one or more of the variable pressure mode, the variable temperature mode and the variable flow-rate mode.

Referring to FIG. 6, in operation 615, a second epitaxial region is formed over the first epitaxial region. For example, second layer 124B can be formed over first layer 124A with reference to FIGS. 10-13. The process of forming second layer 124B can include epitaxially growing a semiconductor material of vertical thickness $d_{124B}$ and lateral thickness $d_{124B}$ over first layer 124A using an epitaxial growth process similar to that for growing first layer 124A. The epitaxial growth process for forming second layer 124B can further in-situ dope the second layer 124B with the second n-type dopants (discussed in FIG. 4) of doping profile 404 (shown in FIGS. 4 and 5).

Referring to FIG. 11, in some embodiments, the epitaxial growth process for in-situ doping second layer 124B can be performed at a growth pressure $P_3$. Growth pressure $P_3$ can at least determine doping profile 404's doping concentration $N_{124B}$. For example, doping profile 404's doping concentration $N_{124B}$ can be increased by increasing growth pressure $P_3$. In some embodiments, growth pressure $P_3$ can be less than or substantially equal to growth pressure $P_4$.

Referring to FIG. 12, in some embodiments, the epitaxial growth process for in-situ doping second layer 124B can be performed at a growth temperature $T_3$. Growth temperature $T_3$ can at least determine doping profile 404's doping concentration $N_{124B}$. For example, doping profile 404's doping concentration $N_{124B}$ can be increased by increasing growth temperature $T_3$. In some embodiments, growth temperature $T_3$ can be less than or substantially equal to growth temperature $T_4$.

Referring to FIG. 13, in some embodiments, the epitaxial growth process for in-situ doping second layer 124B can be performed by flowing a second n-type dopant precursor gas with flow rate profile 1304. The second n-type dopant precursor gas can include the second n-type dopant to dope second layer 124B. For example, as previously discussed with respect to FIGS. 4 and 5, the second n-type dopant can be phosphorus, where the respective second n-type dopant precursor gas can include phosphine ($PH_3$). In some embodiments, the second n-type dopant precursor gas can be free from the first n-type dopant discussed with respect to FIGS. 4 and 5. For example, the first n-type dopant that dopes first layer 124A can include arsenic, where the second n-type dopant precursor gas can be arsenic-free (e.g., the second n-type dopant precursor gas's chemical formula does not contain arsenic). The epitaxial growth process for in-situ doping second layer 124B can be performed at a suitable flow rate $F_4$, such as about 100 sccm. Flow rate $F_4$ can at least determine doping profile 404's doping concentration $N_{124B}$. For example, doping profile 404's doping concentration $N_{124B}$ can be increased by increasing flow rate $F_4$. In some embodiments, flow rate $F_4$ can be substantially constant during the growth of second layer 124B. In some embodiments, flow rate $F_4$ can be substantially zero during the epitaxial growth process of forming first layer 124A. In some embodiments, the first n-type dopant precursor gas's flow rate can be substantially zero during the epitaxial growth process of forming second layer 124B.

Referring to FIG. 6, in operation 620, the sacrificial gate structure is replaced with a metal gate structure. For example, sacrificial gate structure 710 can be replaced with gate structure 110 (shown in FIG. 15) with reference to FIGS. 14 and 15. The process of forming gate structure 110 can include (i) forming ILD layer 130 (shown in FIG. 14) over second layer 124B using a suitable deposition process, such as a PVD process and a CVD process; (ii) removing hard mask layer 750 to coplanarizing polysilicon layer 348 with ILD layer 130 using a polishing process, such as a CMP process; (iii) removing polysilicon layer 748 to form a recess structure 1416 (shown in FIG. 14) to expose fin structures 108 using an etching process; and (iv) filling gate dielectric layer 112 and a gate electrode 114 (shown in FIG. 15) in recess structures 1416 using a suitable deposition process, such as ALD, CVD, and PVD. Based on the disclosure herein, other processes for forming gate structure 110 are within the spirit and scope of this disclosure.

After operation 620, a metal contact, such as trench conductor structure 150 (shown in FIGS. 2 and 3), can be formed over S/D region 124 and/or gate structure 110. The process of forming trench conductor structure 150 can include (i) blanket depositing layer of insulating material 148 over gate structure 110 and S/D region 124 via a suitable deposition process, such as a CVD process, a PVD process, and an ALD process; (ii) forming a recess structure (not shown in all figures) through layer of insulating material 148 and ILD layer 130 and using a lithography process and an etching process; (iii) forming silicide layer 152 (shown in FIGS. 2 and 3) in the recess structure; and (iv) forming layer of conductive material 154 (shown in FIGS. 2 and 3) over silicide layer 152 using a suitable deposition process (e.g., a CVD process, an ALD process, a PVD process, and an e-beam evaporation process) and a polishing process (e.g., a CMP process). Based on the disclosure herein, other processes for forming trench conductor structure 150 are within the spirit and scope of this disclosure.

The present disclosures provides embodiments of a transistor S/D structure and a method for forming the same. The transistor can be an NFET, where the transistor's S/D structure can include a n-type layer stack. The n-type layer stack can include a first layer formed over the transistor channel region and doped with a first n-type dopant. The n-type layer stack can include a second layer formed over the first layer and doped with a second n-type dopant. The first n-type dopant doped in the first layer can have a low doping concentration proximate to transistor's channel region to reduce the out-diffusion of the first n-type dopant towards the transistor's channel region. The first n-type dopant doped in the first layer can further have a doping peak proximate to the second layer to prevent the second n-type dopant out-diffusing from the second layer towards the transistor's channel region. The second n-type dopant can have a high doping concentration in the second layer to provide a low contact resistance for the transistor. A benefit of the S/D structures, among others, is to reduce the out-diffusion of the n-type dopants towards the channel region, thus reducing the transistor's short channel effect.

In some embodiments, a method can include forming a recess structure in a substrate, and forming a first semiconductor layer over the recess structure. The process of forming the first semiconductor layer can include doping first and second portions of the first semiconductor layer with a first n-type dopant having first and second doping concentrations, respectively. The second doping concentration can be greater than the first doping concentration. The method can further include forming a second semiconductor layer over the second portion of the first semiconductor layer. The process of forming the second semiconductor layer can include doping the second semiconductor layer with a second n-type dopant.

In some embodiments, a method can include forming a fin structure over a substrate, forming a gate structure over the fin structure, and forming a recess structure in the fin structure and adjacent to the gate structure. The method can further include doping, over the recess structure, a first semiconductor layer with a first n-type dopant having a first doping concentration. The method can further include doping, over the first semiconductor layer, a second semiconductor layer with the first n-type dopant having a second doping concentration greater than the first doping concentration. The method can further include doping, over the second semiconductor layer, a third semiconductor layer with a second n-type dopant.

In some embodiments, a semiconductor structure can include a substrate, a fin structure over the substrate, a gate structure over a first portion of the fin structure, and a source/drain (S/D) region formed in a second portion of the fin structure. The S/D region can include a first epitaxial layer doped with a first n-type dopant and in contact with the fin structure. The first n-type dopant can include a doping peak in the first epitaxial layer. The S/D region can further include a second epitaxial layer formed over the first epitaxial layer and doped with a second n-type dopant. A separation between the doping peak and the second epitaxial layer can be less than an other separation between the doping peak and the fin structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a recess structure in a substrate;
   forming, over the recess structure, a first semiconductor layer that comprises doping first and second portions of the first semiconductor layer with a first n-type dopant to form a first horizontal doping profile in the first portion and a second horizontal doping profile in the second portion, wherein the second horizontal doping profile is greater than the first horizontal doping profile, and wherein the second horizontal doping profile comprises a first doping peak; and
   forming, over the second portion of the first semiconductor layer, a second semiconductor layer that comprises doping the second semiconductor layer with a second n-type dopant to form a third horizontal doping profile comprising a second doping peak, wherein a first maxima of the first doping peak is greater than a second maxima of the second doping peak.

2. The method of claim 1, wherein doping the first and second portions of the first semiconductor layer comprises:
   performing a first epitaxial growth process to grow the first portion of the first semiconductor layer over the recess structure at a first growth pressure of a first precursor gas of the first n-type dopant; and
   performing a second epitaxial growth process to grow the second portion of the first semiconductor layer over the first portion of the first semiconductor layer at a second growth pressure of the first precursor gas of the first n-type dopant, wherein the second growth pressure is greater than the first growth pressure.

3. The method of claim 2, wherein performing the first and second epitaxial growth processes comprises performing the first and second epitaxial growth processes over first and second time durations, respectively, wherein the second time duration is less than the first time duration.

4. The method of claim 1, wherein doping the first and second portions of the first semiconductor layer comprises:
   flowing a dopant precursor gas that includes the first n-type dopant at a first flow rate to grow the first portion of the first semiconductor layer over the recess structure, wherein the first, flow rate is greater than zero; and
   flowing the dopant precursor gas at a second flow rate to grow the second portion of the first semiconductor layer over the first portion of the first semiconductor layer, wherein the second flow rate is greater than the first flow rate.

5. The method of claim 4, wherein doping the first and second portions of the first semiconductor layer further comprises:
   flowing the dopant precursor gas to grow the first portion of the first semiconductor layer over a first time duration; and
   flowing the dopant precursor gas to grow the second portion of the first semiconductor layer over a second time duration less than the first time duration.

6. The method of claim 1, wherein doping the first and second portions of the first semiconductor layer comprises:
   performing a first epitaxial growth process to grow the first portion of the first semiconductor layer over the recess structure at a first growth temperature; and
   performing a second epitaxial growth process to grow the second portion of the first semiconductor layer over the first portion of the first semiconductor layer at a second growth temperature greater than the first growth temperature.

7. The method of claim 6, wherein performing the first and second epitaxial growth processes comprises performing the first and second epitaxial growth processes over first and second time durations, respectively, wherein the second time duration is less than the first time duration.

8. A method, comprising:
   forming a fin structure over a substrate;
   forming a gate structure over the fin structure;
   forming a recess structure in the fin structure and adjacent to the gate structure;
   doping, over the recess structure, a first semiconductor layer with a first n-type dopant to form a first doping profile along a direction parallel to the substrate;
   doping, over the first semiconductor layer, a second semiconductor layer with the first n-type dopant to form a second doping profile along the direction, wherein the second doping profile is greater than the first doping profile, and wherein the second doping profile comprises a first doping peak; and doping, over the second semiconductor layer, a third semiconductor layer with a second n-type dopant to form a third doping profile along the direction, wherein the third doping profile comprises a second doping peak lower than the first doping peak.

9. The method of claim 8, wherein doping the first, second, and third semiconductor layers comprises performing first, second, and third epitaxial growth processes at a first growth pressure of a first precursor gas of the first n-type dopant, a second growth pressure of the first precursor gas of the first n-type dopant, and a third growth pressure of a second precursor gas of the second n-type dopant, respectively, wherein the first and third growth pressures are less than the second growth pressure.

10. The method of claim 9, wherein performing the first and second epitaxial growth processes comprises performing the first and second epitaxial growth processes over first and second time durations, respectively, wherein the second time duration is less than the first time duration.

11. The method of claim 8, wherein doping the first and second semiconductor layers comprises:

flowing a dopant precursor gas that includes the first n-type dopant at a first flow rate to grow the first semiconductor layer, wherein the first flow rate is greater than zero; and flowing the dopant precursor gas at a second flow rate to grow the second semiconductor layer, wherein the second flow rate is greater than the first flow rate.

12. The method of claim 11, wherein doping the first and second semiconductor layers further comprises:

flowing the dopant precursor gas to grow the first semiconductor layer over a first time duration; and flowing the dopant precursor gas to grow the second semiconductor layer over a second time duration less than the first time duration.

13. The method of claim 8, wherein doping the first, second, and third semiconductor layers comprises performing first, second, and third epitaxial growth processes at first, second, and third growth temperatures, respectively, wherein the first and third growth temperatures are less than the second growth temperature.

14. The method of claim 13, wherein performing the first and second epitaxial growth processes comprises performing the first and second epitaxial growth processes over first and second time durations, respectively, wherein the second time duration is less than the first time duration.

15. A semiconductor structure, comprising:

a substrate;

a fin structure over the substrate;

a gate structure over a first portion of the fin structure; and a source/drain (S/D) region formed in a second portion of the fin structure, wherein the S/D region comprises:

a first epitaxial layer doped with a first n-type dopant and in contact with the fin structure, wherein a first doping profile of the first n-type dopant and along a horizontal direction comprises a first doping peak in the first epitaxial layer, and wherein the horizontal direction is parallel to a top surface of the substrate; and a second epitaxial layer formed over the first epitaxial layer and doped with a second n-type dopant having a second doping profile along the horizontal direction, wherein the second doping profile comprises a second doping peak in the second epitaxial layer, and wherein the second doping peak is lower than the first doping peak.

16. The semiconductor structure of claim 15, wherein a ratio of a width associated with the first doping peak to a thickness of the first epitaxial layer is from about 0.1 to about 0.5.

17. The semiconductor structure of claim 15, wherein the first epitaxial layer is doped with a first doping gradient proximate to the fin structure and a second doping gradient proximate to the first doping peak, wherein the second doping gradient is greater than the first doping gradient.

18. The semiconductor structure of claim 15, where a ratio of a height of the S/D region to a height of the fin structure is between about 0.8 and about 1.3.

19. The semiconductor structure of claim 15, where a width of the second doping peak is greater than a width of the first doping peak.

20. The semiconductor structure of claim 15, where a first horizontal distance between a first position having a maxima of the first doping peak and a second position having a concentration of the first n-type dopant about 10% of the maxima is less than a second horizontal distance between the second position and a nearest sidewall of the first epitaxial layer.

* * * * *

UNITED STATES PATENT AND TRADEMARK OFFICE
CERTIFICATE OF CORRECTION

PATENT NO. : 12,040,384 B2
APPLICATION NO. : 17/459469
DATED : July 16, 2024
INVENTOR(S) : Chen Page 1 of 1

It is certified that error appears in the above-identified patent and that said Letters Patent is hereby corrected as shown below:

In the Claims

In Column 20, Claim 4, Line 26, delete "first," and insert -- first --, therefor.

Signed and Sealed this
Thirty-first Day of December, 2024

Derrick Brent
*Acting Director of the United States Patent and Trademark Office*